United States Patent
Kim et al.

(10) Patent No.: US 12,218,179 B2
(45) Date of Patent: Feb. 4, 2025

(54) DISPLAY DEVICE HAVING LIGHT BLOCKING PART IN NON-DISPLAY AREA AND TILED DISPLAY DEVICE INCLUDING THE SAME

(71) Applicant: Samsung Display Co., LTD., Yongin-si (KR)

(72) Inventors: Hyun Hyang Kim, Suwon-si (KR); Jeong Weon Seo, Hwaseong-si (KR); Min Gwan Hyun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 402 days.

(21) Appl. No.: 17/701,207

(22) Filed: Mar. 22, 2022

(65) Prior Publication Data

US 2023/0027254 A1   Jan. 26, 2023

(30) Foreign Application Priority Data

Jul. 26, 2021 (KR) .................. 10-2021-0097691

(51) Int. Cl.
*H01L 27/15* (2006.01)
*H01L 33/50* (2010.01)
*H01L 33/58* (2010.01)

(52) U.S. Cl.
CPC ............ *H01L 27/156* (2013.01); *H01L 33/50* (2013.01); *H01L 33/58* (2013.01)

(58) Field of Classification Search
CPC ....... H01L 27/156; H01L 33/50; H01L 33/58; H01L 25/167
USPC ........................................................ 257/89
See application file for complete search history.

(56) References Cited

U.S. PATENT DOCUMENTS

| | | |
|---|---|---|
| 2005/0122032 A1 | 6/2005 | Jeong et al. |
| 2008/0094565 A1 | 4/2008 | Jeong et al. |
| 2017/0045782 A1 | 2/2017 | Cho |
| 2019/0384084 A1 | 12/2019 | Tang et al. |
| 2020/0066787 A1* | 2/2020 | Park ............ H01L 27/156 |
| 2021/0126056 A1 | 4/2021 | Kim et al. |
| 2021/0200365 A1 | 7/2021 | Lee et al. |

FOREIGN PATENT DOCUMENTS

| | | |
|---|---|---|
| KR | 2005-0055358 | 6/2005 |
| KR | 2016-0129733 A | 11/2016 |
| KR | 2017-0020594 | 2/2017 |
| KR | 2020-0072740 A | 6/2020 |
| KR | 2021-0052618 | 5/2021 |
| KR | 2021-0083606 | 7/2021 |

* cited by examiner

*Primary Examiner* — Quoc D Hoang
(74) *Attorney, Agent, or Firm* — Lewis Roca Rothgerber Christie LLP

(57) ABSTRACT

A display device including: a substrate having a display area and a non-display area extending around the display area, the display area having emission areas and a light blocking area; a thin film transistor layer on the substrate and including thin film transistors; a light emitting element layer on the thin film transistor layer and including light emitting elements; a wavelength conversion layer on the light emitting element layer to convert a peak wavelength of light provided from at least some of the light emitting elements; and a color filter layer on the wavelength conversion layer. The color filter layer includes: color filters in each of the emission areas; a first light blocking part in the light blocking area; and a second light blocking part in the non-display area.

20 Claims, 20 Drawing Sheets

DISPLAY DEVICE HAVING LIGHT BLOCKING PART IN NON-DISPLAY AREA AND TILED DISPLAY DEVICE INCLUDING THE SAME

CROSS-REFERENCE TO RELATED APPLICATION

This application claims priority to and the benefit of Korean Patent Application No. 10-2021-0097691, filed on Jul. 26, 2021, in the Korean Intellectual Property Office, the contents of which are herein incorporated by reference in their entirety.

BACKGROUND

1. Field

Aspects of embodiments of the present disclosure to a display device and a tiled display device including the same.

2. Description of the Related Art

With the advance of an information-oriented society, there is increasing demand for display devices for displaying images in various ways. For example, display devices are employed in various electronic devices, such as smartphones, digital cameras, laptop computers, navigation devices, and smart televisions. The display device may be a flat panel display device, such as a liquid crystal display device, a field emission display device, and an organic light emitting display device. In the light emitting display device from among the flat panel display devices, each of pixels of a display panel includes a light emitting element capable of emitting light by itself such that an image can be displayed without a backlight unit providing light to the display panel.

When the display device is manufactured in a large size, a defect rate of the light emitting element may increase due to an increase in the number of pixels, thereby deteriorating productivity or reliability of the display device. One way to overcome this problem is by a tiled display device, in which a large-sized screen may be implemented by connecting a plurality of display devices having a relatively small size together. The tiled display device may have a boundary portion, called a seam, between the plurality of display devices due to a non-display area or a bezel area of each of the plurality of display devices that are adjacent to each other. When a single image is displayed on the entire screen, the boundary portion between the plurality of display devices gives a sense of disconnection over the entire screen, thereby reducing a sense of immersion in the image.

SUMMARY

Aspects of embodiments of the present disclosure provide a display device capable of preventing (or substantially preventing) light from leaking out of the display device and/or reducing a coupling area between a plurality of display devices and reducing a height difference on a top surface in a non-display area or coupling area, and a tiled display device including the same.

Aspects of embodiments of the present disclosure also provide a tiled display device capable of avoiding a sense of disconnection between a plurality of display devices and improving a sense of immersion in an image by preventing (of substantially preventing) the recognition of boundary portions or non-display areas between the plurality of display devices.

However, aspects and features of the present disclosure are not restricted to those set forth herein. The above and other aspects and features of the present disclosure will become more apparent to one of ordinary skill in the art to which the present disclosure pertains by referencing the detailed description given below.

According to an embodiment of the disclosure, a display device includes: a substrate having a display area and a non-display area extending around the display area, the display area having emission areas and a light blocking area; a thin film transistor layer on the substrate and including thin film transistors; a light emitting element layer on the thin film transistor layer and including light emitting elements; a wavelength conversion layer on the light emitting element layer to convert a peak wavelength of light provided from at least some of the light emitting elements; and a color filter layer on the wavelength conversion layer. The color filter layer including: color filters in each of the emission areas; a first light blocking part in the light blocking area; and a second light blocking part in the non-display area.

A height of the second light blocking part may be greater than or equal to a height of the first light blocking part and less than or equal to a height of the color filters.

The non-display area may have a pattern area at where the second light blocking part is arranged and an open area excluding the pattern area, and an area ratio of the pattern area to the open area may be in a range of 1.5 to 3:1.

The second light blocking part may have a closed loop shape extending around the display area.

The second light blocking part may have a circular shape, an elliptical shape, a semicircular shape, or a polygonal shape.

The second light blocking part may include a material that blocks visible light and transmits infrared light.

The color filter layer may further include a plurality of the second light blocking parts, and a width of one of the second light blocking parts at an outermost part of the non-display area may be smaller than a width of another one of the second light blocking parts.

The emission areas may have first to third emission areas emitting different colors, and the wavelength conversion layer may include: a first wavelength conversion part in the first emission area to convert a peak wavelength of light incident from the light emitting elements into a first peak wavelength; a second wavelength conversion part in the second emission area to convert a peak wavelength of light incident from the light emitting elements into a second peak wavelength different from the first peak wavelength; and a light transmission part in the third emission area to transmit the light incident from the light emitting elements.

The color filters may include: a first color filter on the first wavelength conversion part; a second color filter on the second wavelength conversion part; and a third color filter on the light transmission part, and the first light blocking part may be on the wavelength conversion layer and may have a grid shape extending around the first to third color filters.

The color filter layer may further include a plurality of the first light blocking parts, and one of the first light blocking parts at an outermost part from among the first light blocking parts may surround a side surface of the wavelength conversion layer.

The second light blocking part may be on the light emitting element layer and may surround a side surface of the wavelength conversion layer to be spaced apart therefrom.

According to an embodiment of the disclosure, a tiled display device includes: display devices each having a display area and a coupling area between the display areas, each of the display areas having emission areas and a light blocking area; and a bonding member bonding the display devices in the coupling area. Each of the display devices includes: a substrate; a thin film transistor layer on the substrate and including thin film transistors; a light emitting element layer on the thin film transistor layer and including light emitting elements; a wavelength conversion layer on the light emitting element layer to convert a peak wavelength of light provided from at least some of the light emitting elements; and a color filter layer on the wavelength conversion layer. The color filter layer includes: color filters in each of the emission areas; a first light blocking part in the light blocking area; and a second light blocking part in the coupling area.

A height of the second light blocking part may be greater than or equal to a height of the first light blocking part and less than or equal to a height of the color filters.

The coupling area may have a pattern area at where the second light blocking part is arranged and an open area excluding the pattern area, and an area ratio of the pattern area to the open area may be in a range of 1.5 to 3:1.

The second light blocking part may have a closed loop shape extending around the display area.

The second light blocking part may have a circular shape, an elliptical shape, a semicircular shape, or a polygonal shape.

The second light blocking part may include a material that blocks visible light and transmits infrared light.

The bonding member may be configured to bond side surfaces of the substrates, side surfaces of the thin film transistor layers, side surfaces of the light emitting element layers, and side surfaces of the second light blocking parts of the display devices.

Each of the display devices may further include: an encapsulation layer on the color filter layer; and an anti-reflection layer on the encapsulation layer to prevent reflection of external light.

The tiled display device may further include a cover member covering the anti-reflection layer of each of the display devices and a top surface of the bonding member.

In the display device and the tiled display device including the same according to embodiments of the present disclosure, light may not leak out of the display device or may not leak from a coupling area of a plurality of display devices and a height difference on a top surface in the non-display area or the coupling area may be reduced by including a light blocking part disposed in the non-display area or the coupling area. Accordingly, the coupling area of the tiled display device may not be recognized by the user and a sense of disconnection between the plurality of display devices may be mitigated, thereby improving a sense of immersion in the image.

The aspects and features of the present disclosure are not limited to the aforementioned aspects and features, and various other aspects and features are included in the present disclosure.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
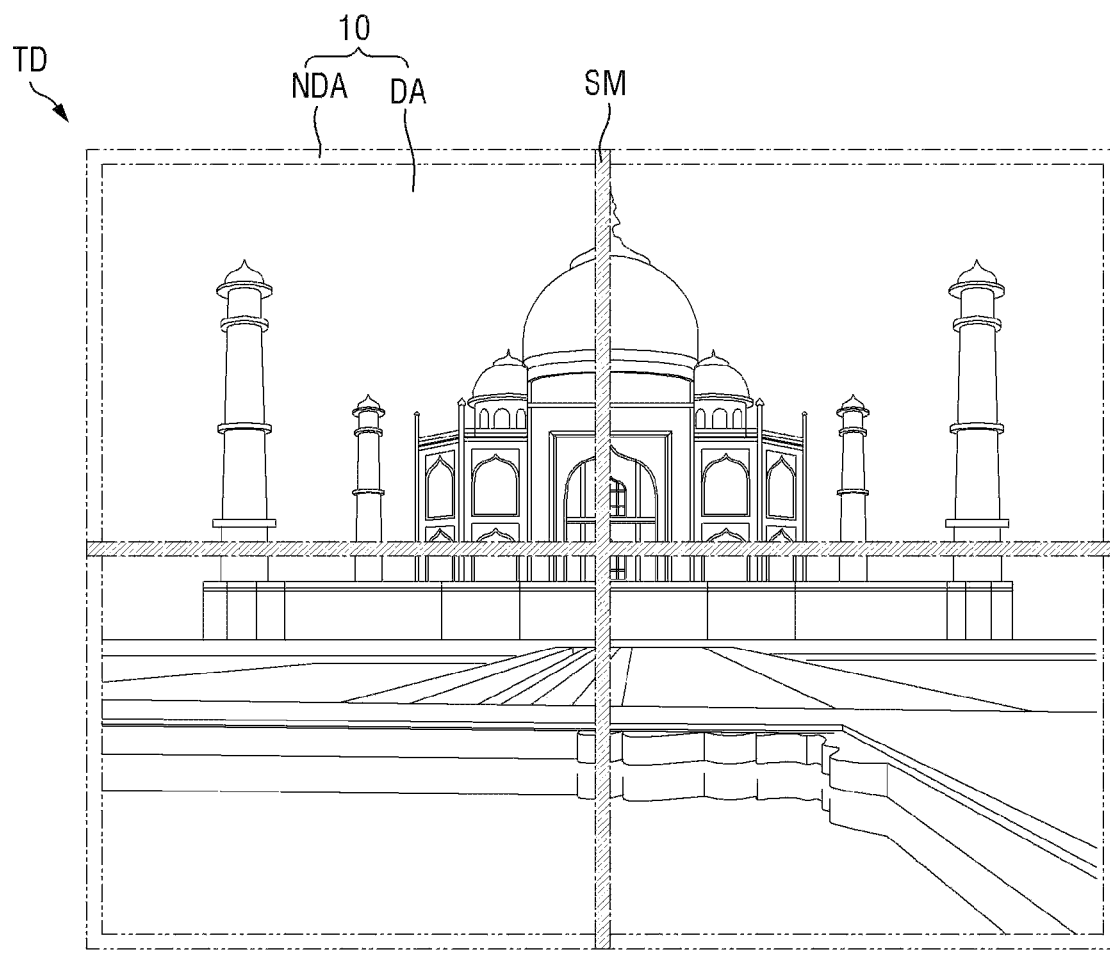
FIG. 1 is a plan view illustrating a tiled display device according to one embodiment.
Figure 1:
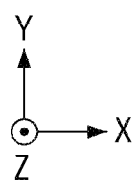

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the disclosures disclosed herein. It is apparent, however, that various embodiments may be practiced without these specific details or with one or more equivalent arrangements. In other instances, well-known structures and devices are shown in block diagram form in order to avoid unnecessarily obscuring the various embodiments. Further, various embodiments may be different but do not have to be exclusive. For example, specific shapes, configurations, and characteristics of an embodiment may be used or implemented in other embodiments without departing from the present disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements") of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the terms "connected" and "coupled" may refer to physical, electrical, and/or fluid connection, with or without intervening elements.

Further, the X-axis, the Y-axis, and the Z-axis are not limited to three axes of a rectangular coordinate system, and thus, the X-, Y-, and Z-axes, and they may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be understood as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "has," 'having," "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a plan view illustrating a tiled display device according to one embodiment.

Referring to FIG. 1, a tiled display device TD may include a plurality of display devices 10. The plurality of display devices 10 may be arranged in a grid form but are not limited thereto. The plurality of display devices 10 may be connected in the first direction (X-axis direction) and/or the second direction (Y-axis direction), and the tiled display device TD may have a particular shape. For example, the plurality of display devices 10 may have the same size, but are not limited thereto. As another example, the plurality of display devices 10 may have different sizes from each other.

Each of the plurality of display devices 10 may have a rectangular shape including long sides and short sides. The plurality of display devices 10 may be arranged such that the long sides or the short sides thereof are connected to each other. Some of the display devices 10 may be disposed at the edge of the tiled display device TD to form one side of the tiled display device TD. Some others of the display devices 10 may be disposed at corners of the tiled display device TD to form two adjacent sides of the tiled display device TD. Yet some others of the display devices 10 may be disposed on the inner side of the tiled display device TD and may be surrounded (e.g., surrounded along their periphery) by other display devices 10.

Each of the plurality of display devices 10 may have a display area DA and a non-display area NDA. The display area DA may include a plurality of pixels to display an image. Each of the plurality of pixels may include an organic light emitting diode including an organic light emitting layer, a micro LED, a quantum dot light emitting diode including a quantum dot light emitting layer, or an inorganic light emitting element including an inorganic semiconductor. In the following, an embodiment in which each of the plurality of pixels includes an inorganic light emitting element will be primarily described, but the present disclosure is not limited thereto. The non-display area NDA may be disposed around the display area DA to surround (e.g., to surround a periphery of) the display area DA and may not display an image (e.g., an image may not be displayed at the non-display area NDA).

The tiled display device TD may have a planar shape as a whole but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. As another example, the plurality of display devices 10 may each have a planar shape and may be connected to each other at an angle (e.g., a predetermined angle) so that the tiled display device TD may have a three-dimensional shape.

The tiled display device TD may have a coupling area SM disposed between a plurality of display areas DA. The coupling area SM of the tiled display device TD may be formed by connecting non-display areas NDA of the adjacent display devices 10. The plurality of display devices 10 may be connected to each other through a bonding member or an adhesive member disposed in the coupling area SM. Each of the coupling areas SM of the plurality of display devices 10 may not include (or may omit) a pad part or a flexible film attached to the pad part. The distance between the display areas DA of the plurality of display devices 10 may be small enough such that the coupling area SM between the plurality of display devices 10 is not recognized by the user. The reflectance of external light at the display areas DA of the plurality of display devices 10 may be substantially the same as at the coupling area SM between the plurality of display devices 10. Accordingly, in the tiled display device TD, the coupling area SM between the plurality of display devices 10 may not be recognized by the user, thereby reducing a sense of disconnection between the plurality of display devices 10 and improving a sense of immersion in an image.

Figure 2:
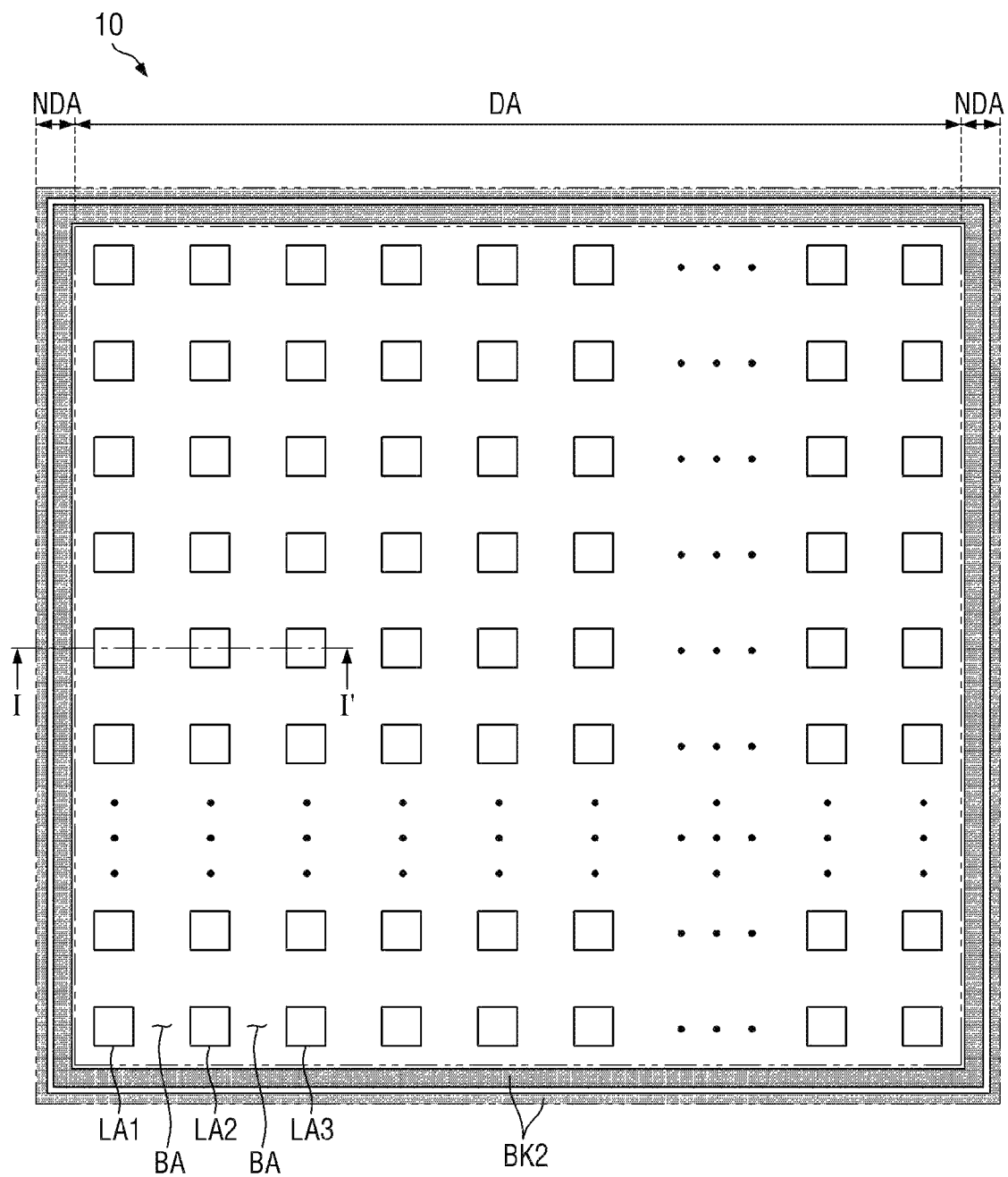
FIG. 2 is a plan view illustrating a display device according to one embodiment.

FIG. 2 is a plan view illustrating a display device according to one embodiment.

Referring to FIG. 2, the display device 10 may include a plurality of pixels arranged along a plurality of rows and columns in the display area DA. Each of the plurality of pixels may have an emission area LA defined by a pixel defining layer or bank and may emit light having a peak wavelength (e.g., a predetermined peak wavelength) through the emission area LA. For example, the display area DA of the display device 10 may have first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in a range of about 610 nm to about 650 nm, the second color light may be green light having a peak wavelength in a range of about 510 nm to about 550 nm, and the third color light may be blue light having a peak wavelength in a range of about 440 nm to about 480 nm, but the present disclosure is not limited thereto.

The first to third emission areas LA1, LA2, and LA3 may be sequentially arranged repetitively in the first direction (e.g., the X-axis direction) in the display area DA. For example, the first emission area LA1 may be larger in size than the second emission area LA2, and the second emission area LA2 may be larger in size than the third emission area LA3. As another example, the first emission area LA1, the second emission area LA2, and the third emission area LA3 may have substantially the same size.

The display area DA of the display device 10 may include a light blocking area BA surrounding (e.g., extending around a periphery of) the plurality of emission areas LA. The light blocking area BA may prevent the colored lights emitted from the first to third emission areas LA1, LA2, and LA3 from mixing with one another.

The non-display area NDA of the display device 10 may include a second light blocking part BK2 surrounding (e.g., extending around a periphery of) the display area DA. The second light blocking part BK2 may have at least a closed loop shape but is not limited thereto. When the non-display area NDA includes a plurality of second light blocking parts BK2, the plurality of second light blocking parts BK2 may be spaced apart from each other by a distance (e.g., by a predetermined distance). For example, the width of the second light blocking part BK2 disposed at the outermost part of the non-display area NDA may be smaller than the width of another second light blocking part BK2 but is not limited thereto. As another example, the width of the second light blocking part BK2 disposed at the outermost part of the non-display area NDA may be substantially the same as the width of another second light blocking part BK2. The second light blocking part BK2 may block transmission of light. Accordingly, the second light blocking part BK2 may prevent light from leaking to the outside of the display device 10.

Figure 3:
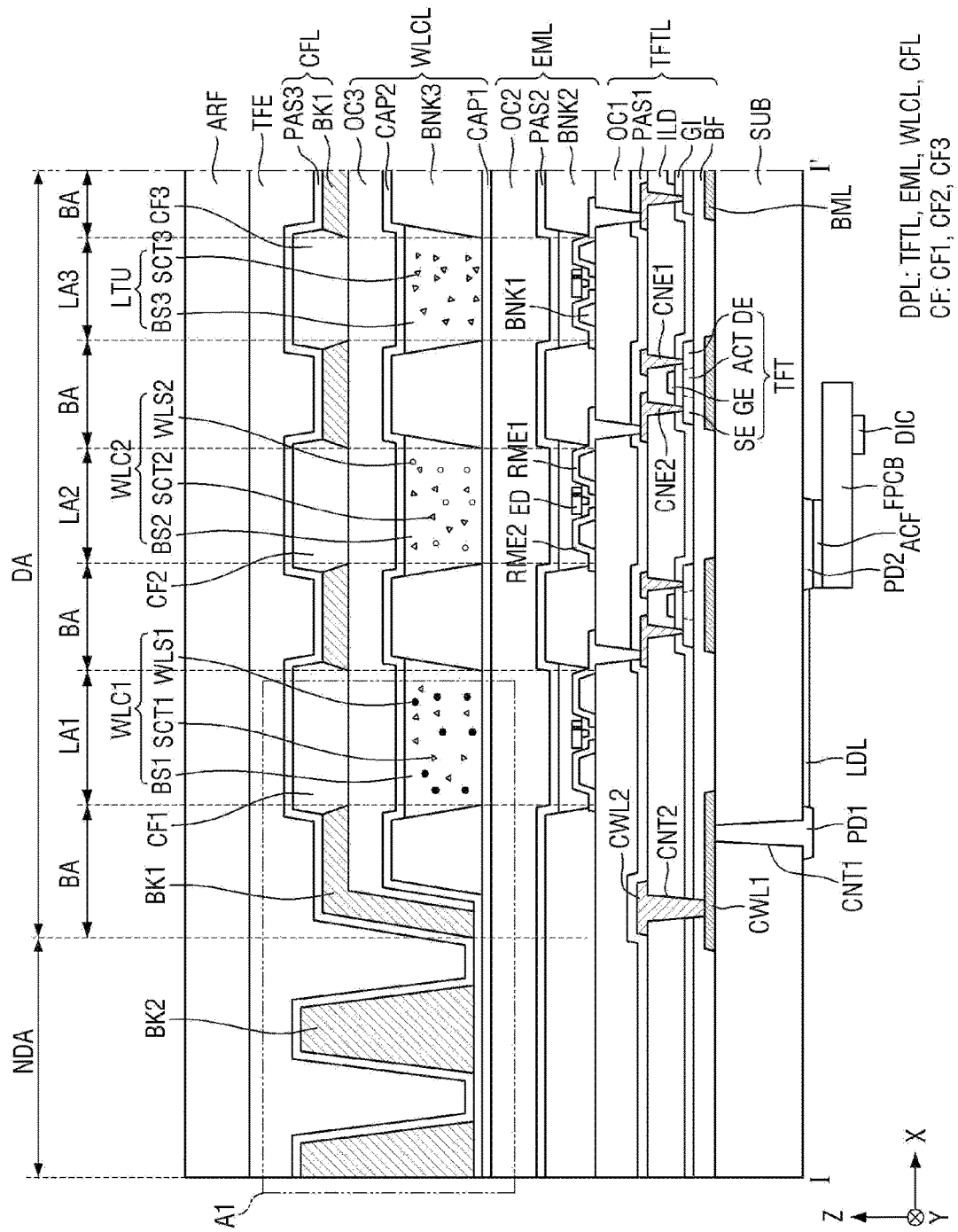
FIG. 3 is a cross-sectional view taken along the line I-I' of FIG. 2.
Figure 4:
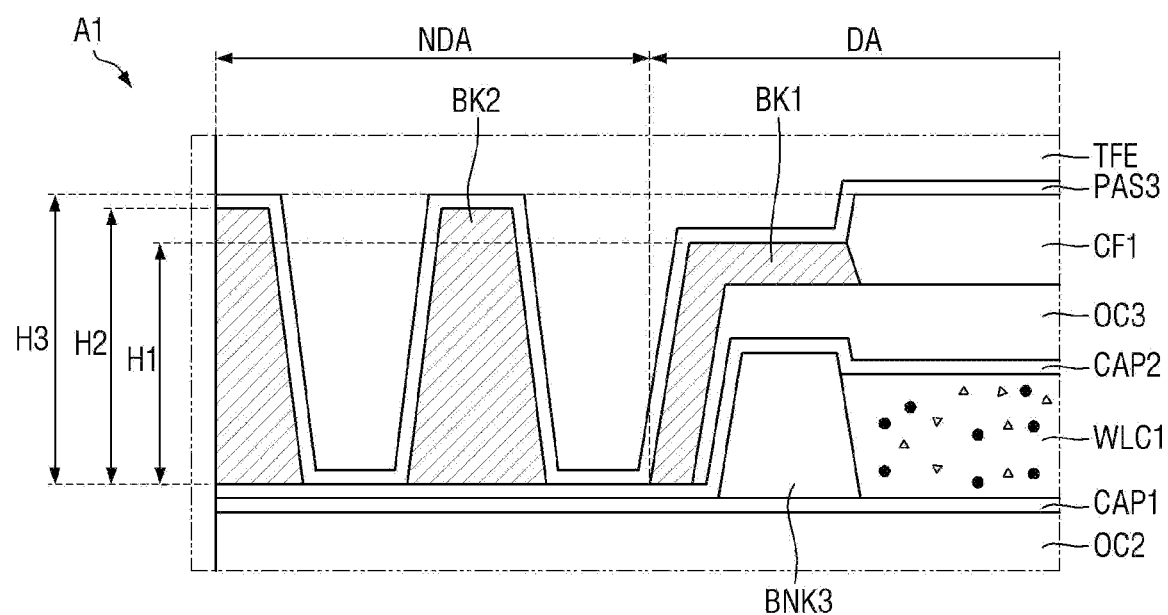
FIG. 4 is an enlarged view of the area A1 in FIG. 3.

FIG. 3 is a cross-sectional view taken along the line I-I' of FIG. 2, and FIG. 4 is an enlarged view of the area A1 in FIG. 3.

Referring to FIGS. 3 and 4, the display area DA of the display device 10 may have first to third emission areas LA1, LA2, and LA3. Each of the first to third emission areas LA1, LA2, and LA3 may be an area in which light generated from a light emitting diode ED of the display device 10 is emitted to the outside of the display device 10.

The display device 10 may include a substrate SUB, a display layer DPL, an encapsulation layer TFE, an anti-reflection layer ARF, a first pad part PD1, a lead line LDL, a second pad part PD2, a flexible film FPCB, and a data driver DIC.

The substrate SUB may be a base substrate or a base member. The substrate SUB may support the display device 10. The substrate SUB may include the display area DA formed of (or formed by) the first to third emission areas LA1, LA2, LA3 and the light blocking area BA, and the non-display area NDA surrounding (e.g., extending around the periphery of) the display area DA. For example, the substrate SUB may include a glass material but is not limited thereto. As another example, the substrate SUB may include a polymer resin, such as polyimide (PI). The substrate SUB may have a first contact hole (e.g., a first contact hole) CNT1 into which the first pad part PD1 extends (or is inserted).

The display layer DPL may be disposed on the substrate SUB. The display layer DPL may include a thin film transistor layer TFTL, a light emitting element layer EML, a wavelength conversion layer WLCL, and a color filter layer CFL. The thin film transistor layer TFTL may include a metal layer BML, a first connection line CWL1, a buffer layer BF, a thin film transistor TFT, a gate insulating layer GI, an interlayer insulating layer ILD, first and second connection electrodes CNE1 and CNE2, a second connection line CWL2, a first passivation layer PAS1, and a first planarization layer OC1.

The metal layer BML may be disposed on the substrate SUB. The metal layer BML may overlap the thin film transistor TFT in the thickness direction (e.g., the Z-axis direction) to block external light incident on the thin film transistor TFT. For example, the metal layer BML may be formed as a single layer or may include multiple (e.g., a plurality of) layers made of any one of molybdenum (Mo), aluminum (Al), chromium (Cr), gold (Au), titanium (Ti), nickel (Ni), neodymium (Nd), copper (Cu), or an alloy thereof.

The first connection line CWL1 may be disposed on the substrate SUB to be spaced apart from the metal layer BML. The first connection line CWL1 may be made of the same material as that of the metal layer BML. One end of the first connection line CWL1 may be connected to the first pad part PD1, and the other end of the first connection line CWL1 may be connected to the second connection line CWL2. The first connection line CWL1 may supply an electric signal received from the first pad part PD1 to the thin film transistor layer TFTL through the second connection line CWL2.

The buffer layer BF may cover the metal layer BML, the first connection line CWL1, and the substrate SUB. The buffer layer BF may have a second contact hole (e.g., a second contact opening) CNT2 into which the second connection line CWL2 extends (or is inserted). The buffer layer BF may include an inorganic material capable of preventing permeation of air or moisture. For example, the buffer layer BF may include a plurality of inorganic layers laminated (e.g., stacked) alternately.

The thin film transistor TFT may be disposed on the buffer layer BF and may constitute a pixel circuit of each of the plurality of pixels. For example, the thin film transistor TFT may be a switching transistor or a driving transistor of the pixel circuit. The thin film transistor TFT may include a semiconductor region ACT, a gate electrode GE, a drain electrode DE, and a source electrode SE.

The semiconductor region ACT, the drain electrode DE, and the source electrode SE may be arranged on the buffer layer BF. The semiconductor region ACT may overlap the gate electrode GE in the thickness direction and may be insulated from the gate electrode GE by the gate insulating layer GI. The drain electrode DE and the source electrode SE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor region ACT, the drain electrode DE, and the source electrode SE. For example, the gate insulating layer GI may cover the semiconductor region ACT, the drain electrode DE, the source electrode SE, and the buffer layer BF and may insulate the semiconductor region ACT and the gate electrode GE from each other. The second contact hole CNT2 into which the second connection line CWL2 is inserted may be formed in the gate insulating layer GI. The gate insulating layer GI may have a contact hole (e.g., a contact opening) through which each of the first and second connection electrodes CNE1 and CNE2 passes.

The interlayer insulating layer ILD may be disposed on the gate electrode GE. The first contact hole CNT1 into which the second connection line CWL2 is inserted may be formed in the interlayer insulating layer ILD. Therefore, the first contact hole CNT1 may penetrate the interlayer insulating layer ILD, the gate insulating layer GI, and the buffer layer BF. The interlayer insulating layer ILD may have a contact hole (e.g., a contact opening) through which each of the first and second connection electrodes CNE1 and CNE2 passes.

The first and second connection electrodes CNE1 and CNE2 may be disposed to be spaced apart from each other on the interlayer insulating layer ILD. The first connection electrode CNE1 may connect a data line or a power line to the drain electrode DE of the thin film transistor TFT. The first connection electrode CNE1 may contact the drain electrode DE through the contact hole in the interlayer insulating layer ILD and the gate insulating layer GI.

The second connection electrode CNE2 may connect the source electrode SE of the thin film transistor TFT to a first electrode RME1. The second connection electrode CNE2 may contact the source electrode SE through the contact hole in the interlayer insulating layer ILD and the gate insulating layer GI.

The second connection line CWL2 may be disposed on the interlayer insulating layer ILD to be spaced apart from the first and second connection electrodes CNE1 and CNE2. The second connection line CWL2 may be formed in the same layer as the first and second connection electrodes CNE1 and CNE2 and may be made of the same material as the first and second connection electrodes CNE1 and CNE2. The second connection line CWL2 may extend into (or may be inserted into) the second contact hole CNT2 and connected to the first connection line CWL1 disposed on the substrate SUB.

For example, the second connection line CWL2 may be connected to the data line to supply a data voltage to the thin film transistor TFT. In another example, the second connection line CLW2 may be connected to the power line to supply a power voltage to the thin film transistor TFT.

The first passivation layer PAS1 may cover the first and second connection electrodes CNE1 and CNE2, the second connection line CLW2, and the interlayer insulating layer ILD. The first passivation layer PAS1 may protect the thin film transistor TFT. The first passivation layer PAS1 may have a contact hole (e.g. a contact opening) through which the first electrode RME1 passes.

The first planarization layer OC1 may be provided on the first passivation layer PAS1 to planarize a top portion (or a top surface) of the thin film transistor layer TFTL. For example, the first planarization layer OC1 may have a contact hole (e.g. a contact opening) through which the first electrode RME1 passes. In one embodiment, the contact hole in the first planarization layer OC1 may be connected to (e.g., may extend into or continuously with) the contact hole in the first passivation layer PAS1. The first planarization layer OC1 may include an organic material.

The light emitting element layer EML may include the first electrode RME1, a second electrode RME2, a light emitting element ED, a first bank BNK1, a second bank BNK2, a second passivation layer PAS2, and a second planarization layer OC2.

The first electrode RME1 may be disposed on the first planarization layer OC1. For example, the first electrode RME1 may be disposed on the first bank BNK1 provided on the first planarization layer OC1. The first electrode RME1 may be disposed to overlap one of the first to third emission areas LA1, LA2, and LA3 defined by the second bank BNK2. The first electrode RME1 may contact the source electrode SE of the thin film transistor TFT through the second connection electrode CNE2. The first electrode RME1 may be an anode electrode of the light emitting element ED but is not limited thereto.

The second electrode RME2 may be disposed on the first planarization layer OC1 to be spaced apart from the first electrode RME1. For example, the second electrode RME2 may be disposed on the first bank BNK1, which is provided on the first planarization layer OC1. The second electrode RME2 may be disposed to overlap one of the first to third emission areas LA1, LA2, and LA3 defined by the second bank BNK2. For example, the second electrode RME2 may receive a low potential voltage supplied from a low potential line to all of the pixels. The second electrode RME2 may be a cathode electrode of the light emitting element LED but is not limited thereto.

The light emitting diode ED may be disposed between the first electrode RME1 and the second electrode RME2 on the first planarization layer OC1. One end of the light emitting diode ED may be electrically connected to the first electrode RME1, and the other end of the light emitting diode ED may be electrically connected to the second electrode RME2. The light emitting diode ED may have a micro-meter or nano-meter size and may be an inorganic light emitting diode including an inorganic material. The inorganic light emitting diode may be aligned between two electrodes (e.g., between the first electrode RME1 and the second electrode RME2) facing each other by an electric field formed in a specific direction between the two electrodes.

For example, a plurality of light emitting diodes ED may include active layers having the same material and configured to emit light of the same wavelength band (e.g., to emit light of the same color). Light emitted from each of the first to third emission areas LA1, LA2, and LA3 may have the same color. For example, the light emitting diodes ED may emit the third color light (e.g., blue light having a peak wavelength in the range of about 440 nm to about 480 nm). Therefore, the light emitting element layer EML may emit the third color light (e.g., blue light).

The second bank BNK2 may be disposed in the light blocking area BA on the first planarization layer OC1. The second bank BNK2 may define the first to third emission areas LA1, LA2 and LA3. For example, the second bank BNK2 may surround (e.g., may extend around a periphery of) each of the first to third emission areas LA1, LA2, and LA3 but is not limited thereto. The second bank BNK2 may separate and insulate the first electrode RME1 or the second electrode RME2 of each of the plurality of light emitting elements ED.

The second passivation layer PAS2 may be disposed on the plurality of light emitting elements ED and the second bank BNK2. The second passivation layer PAS2 may cover the plurality of light emitting elements ED and may protect the plurality of light emitting elements ED. The second passivation layer PAS2 may prevent infiltration of impurities, such as moisture or air, from the outside to prevent damage to the plurality of light emitting elements ED.

The second planarization layer OC2 may be provided on the second passivation layer PAS2 to planarize a top portion (or a top surface) of the light emitting element layer EML. For example, the second planarization layer OC2 may include an organic material.

The wavelength conversion layer WLCL may include a first capping layer CAP1, a third bank BNK3, a first wavelength conversion part WLC1, a second wavelength conversion part WLC2, a light transmission part LTU, a second capping layer CAP2, and a third planarization layer OC3.

The first capping layer CAP1 may be disposed on the second planarization layer OC2 of the light emitting element layer EML. The first capping layer CAP1 may seal the bottom surfaces of the light transmission part LTU and the first and second wavelength conversion parts WLC1 and WLC2. For example, the first capping layer CAP1 may include an inorganic material.

The third bank BNK3 may be disposed in the light blocking area BA on the first capping layer CAP1. The third bank BNK3 may overlap the second bank BNK2 in the thickness direction. The third bank BNK3 may surround (e.g., may extend around a periphery of) the first and second wavelength conversion parts WLC1 and WLC2 and the light transmission part LTU in a plan view. The third bank BNK3 may block transmission of light. For example, the third bank BNK3 may prevent light infiltration and color mixture between the first to third emission areas LA1, LA2, and LA3, which improves color reproducibility of the display device 10. The third bank BNK3 may have a grid shape surrounding (e.g., around) the first to third emission areas LA1, LA2, and LA3 in a plan view.

The first wavelength conversion part WLC1 may be disposed in the first emission area LA1 on the first capping layer CAP1. The first wavelength conversion part WLC1 may be surrounded (e.g., surrounded in a plan view) by the third bank BNK3. The first wavelength conversion part WLC1 may include a first based resin BS1, a first scatterer SCT1, and a first wavelength shifter WLS1.

The first base resin BS1 may include (or contain) a material having a relatively high light transmittance. The first base resin BS1 may be formed of a transparent organic material. For example, the first base resin BS1 may include (or contain) at least one organic material, such as an epoxy resin, an acrylic resin, a cardo resin, or an imide resin.

The first scatterer SCT1 may have a refractive index different from that of the first base resin BS1 and may form an optical interface with the first base resin BS1. For example, the first scatterer SCT1 may include (or contain) a light scattering material or light scattering particles that scatter at least some of the transmitted light. For example, the first scatterer SCT1 may include (or contain) a metallic oxide, such as titanium oxide (TiO$_2$), zirconium oxide (ZrO$_2$), aluminum oxide (AL$_2$O$_3$), indium oxide (In$_2$O$_3$), zinc oxide (ZnO), or tin oxide (SnO$_2$), or may include (or contain) organic particles, such as acrylic resin and urethane resin. The first scatterer SCT1 may scatter light in random directions regardless of the incidence direction of the incident light without any substantial change of the peak wavelength of the incident light.

The first wavelength shifter WLS1 may change (or shift) the peak wavelength of the incident light to a first peak wavelength. For example, the first wavelength shifter WLS1 may convert blue light provided from the display device 10 into red light having a single peak wavelength in the range of about 610 nm to about 650 nm and may emit the red light. The first wavelength shifter WLS1 may be a quantum dot, a quantum rod, or a fluorescent substance. The quantum dot may be a particulate material that emits light of a specific color when an electron transitions from a conduction band to a valence band.

Some of the blue light emitted from the light emitting element layer EML may pass through the first wavelength conversion part WLC1 without being converted to red light by the first wavelength shifter WLS1. From among the blue light emitted from the light emitting element layer EML, the light incident on the first color filter CF1 without being converted by the first wavelength conversion part WLC1 may be blocked by the first color filter CF1. The red light produced by the first wavelength conversion part WLC1 that converts the blue light emitted from the light emitting element layer EML may pass through the first color filter CF1 to be emitted to the outside. Accordingly, the red light may be emitted from the first emission area LA1.

The second wavelength conversion part WLC2 may be disposed in the second emission area LA2 on the first capping layer CAP1. The second wavelength conversion part WLC2 may be surrounded (e.g., surrounded in a plan view) by the third bank BNK3. The second wavelength conversion part WLC2 may include a second base resin BS2, a second scatterer SCT2, and a second wavelength shifter WLS2.

The second base resin BS2 may include (or contain) a material having a relatively high light transmittance. The second base resin BS2 may be formed of a transparent organic material. For example, the second base resin BS2 may be made of the same material as the first base resin BS1, or may be made of one or more of the materials described in association with the first base resin BS1.

The second scatterer SCT2 may have a refractive index different from that of the second base resin BS2 and may form an optical interface with the second base resin BS2. For example, the second scatterer SCT2 may include (or contain) a light scattering material or light scattering particles scattering at least some of the transmitted light. For example, the second scatterer SCT2 may be made of the same material as the first scatterer SCT1, or may be made of one or more of the materials described in association with the first scatterer SCT1.

The second wavelength shifter WLS2 may change (or shift) the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to about 550 nm and emit the green light. The second wavelength shifter WLS2 may be a quantum dot, a quantum rod, or a fluorescent substance. The second wavelength shifter WLS2 may include (or contain) the materials identical in purpose with the materials described in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission part LTU may be disposed in the third emission area LA3 on the first capping layer CAP1. The light transmission part LTU may be surrounded (e.g., surrounded in a plan view) by the third bank BNK3. The light transmission part LTU may allow the incident light to pass therethrough while maintaining the peak wavelength of the light. The light transmission part LTU may include a third base resin BS3 and a third scatterer SCT3.

The third base resin BS3 may include (or contain) a material having a relatively high light transmittance. The third base resin BS3 may be formed of a transparent organic material. For example, the third base resin BS3 may be made of the same material as the first base resin BS1 or the second base resin BS2, or may be made of one or more of the materials described in association with the first base resin BS1.

The third scatterer SCT3 may have a refractive index different from that of the third base resin BS3 and may form an optical interface with the third base resin BS3. For example, the third scatterer SCT3 may include (or contain) a light scattering material or light scattering particles scattering at least a part of the transmitted light. For example, the third scatterer SCT3 may be formed of the same material as the first scatterer SCT1 or the second scatterer SCT2, or may be made of one or more of the materials described in association with the first scatterer SCT1.

Because the wavelength conversion layer WLCL is disposed directly on the second planarization layer OC2 of the light emitting element layer EML, the display device 10 may not require (or may omit) a separate substrate for the first and second wavelength conversion parts WLC1 and WLC2 and the light transmission part LTU. Accordingly, the first and second wavelength conversion parts WLC1 and WLC2 and the light transmission part LTU may be easily aligned in the first to third emission areas LA1, LA2, and LA3, respectively, and the thickness of the display device 10 may be relatively reduced.

The second capping layer CAP2 may be disposed on the first and second wavelength conversion parts WLC1 and WLC2, the light transmission part LTU, and the third bank BNK3 in the display area DA. The second capping layer CAP2 may cover the outermost side surface of the third bank BNK3 in the display area DA and may be disposed on the first capping layer CAP1 in the non-display area NDA. For example, the second capping layer CAP2 may seal the first and second wavelength conversion parts WLC1 and WLC2 and the light transmission part LTU to prevent the first and second wavelength conversion parts WLC1 and WLC2 and the light transmission part LTU from damage or contamination. For example, the second capping layer CAP2 may include an inorganic material.

The third planarization layer OC3 may be disposed on the second capping layer CAP2 in the display area DA to planarize top portions (or top surfaces) of the first and second wavelength conversion parts WLC1 and WLC2 and the light transmission part LTU. For example, the third planarization layer OC3 may include an organic material.

The color filter layer CFL may include a first light blocking part BK1, a second light blocking part BK2, first to third color filters CF1, CF2, and CF3, and a third passivation layer PAS3.

The first light blocking part BK1 may be disposed in the light blocking area BA on the third planarization layer OC3 of the wavelength conversion layer WLCL. The first light blocking part BK1 may overlap the third bank BNK3 or the second bank BNK2 in the thickness direction. The first light blocking part BK1 may cover the side surface of the third planarization layer OC3 at the edge of the display area DA. The first light blocking part BK1, disposed at the outermost part from among the first light blocking parts BK1, may surround (e.g., may extend around a periphery of) the side surface of the wavelength conversion layer WLC. The first light blocking part BK1 may block transmission of light. The first light blocking part BK1 may prevent light infiltration and color mixture between the first to third emission areas LA1, LA2, and LA3, which improves color reproducibility of the display device 10. The first light blocking part BK1 may have a grid shape surrounding (e.g. extending around periperies of) the first to third emission areas LA1, LA2, and LA3 in a plan view.

For example, the first light blocking part BK1 may include an organic black pigment but is not limited thereto. The organic black pigment may include at least one of lactam black, perylene black, or aniline black.

The second light blocking part BK2 may be disposed on the second capping layer CAP2 in the non-display area NDA. The second light blocking part BK2 may surround the display area DA in a plan view. The second light blocking part BK2 may have a closed loop shape in a plan view, but it is not limited thereto. The second light blocking part BK2 may have a shape of a partition wall in a cross-sectional view, but it is not limited thereto. When the non-display area NDA includes a plurality of second light blocking parts BK2, the plurality of second light blocking parts BK2 may be spaced apart from each other by a distance (e.g., by a predetermined distance). For example, the second light blocking part BK2 disposed at the outermost part of the non-display area NDA may be cut by (or during) a cutting process. The second light blocking part BK2 may block transmission of light. Accordingly, the second light blocking part BK2 may prevent light from leaking to the outside of the display device 10.

The second light blocking part BK2 may be made of the same material in the same process as that of the first light blocking part BK1, but it is not limited thereto. For example, the second light blocking part BK2 may include an organic black pigment but is not limited thereto. The organic black pigment may include at least one of lactam black, perylene black, or aniline black.

In FIG. 4, a height H2 of the second light blocking part BK2 may be higher than a height H1 of the first light blocking part BK1 but lower than a height H3 of the first color filter CF1 (H1≤H2≤H3). In one embodiment, the height H3 of the first color filter CF1 may correspond to a length (or a distance) from the bottom surface of the second light blocking part BK2 to the top surface of the first color filter CF1. The height H3 of the first color filter CF1 may be substantially the same as the heights of the second and third color filters CF2 and CF3. As the height H2 of the second light blocking part BK2 increases, the distance between the second light blocking part BK2 and the anti-reflection layer ARF may decrease. As the height H2 of the second light blocking part BK2 becomes closer to the height H3 of the first color filter CF1, a height difference in the anti-reflection layer ARF in the non-display area NDA may decrease. Accordingly, by including the second light blocking part BK2, the display device 10 may prevent light from leaking out of the display device 10 and reduce a height difference in the anti-reflection layer ARF at the outside of the display device 10 (e.g., at the outside of the display area DA).

The second light blocking part BK2 may block visible light and transmit infrared light. For example, the second light blocking part BK2 may be cut in the thickness direction (e.g., the Z-axis direction) by the cutting process using an infrared laser during a manufacturing process of the display device 10. The second light blocking part BK2 transmits infrared light, thereby reducing or minimizing an area to which heat of the laser is transmitted when the infrared laser is irradiated and an area damaged by the laser may be reduced or minimized. As the infrared transmittance of the second light blocking part BK2 increases, an area damaged by the laser may be reduced. Accordingly, because the display device 10 includes the second light blocking part BK2 that blocks visible light but transmits infrared light, a damaged area of the second light blocking part BK2 may be reduced or minimized in the laser cutting process, thereby reducing the tolerance of the cutting process and reducing or minimizing the size of the non-display area NDA.

The first color filter CF1 may be disposed in the first emission area LA1 on the third planarization layer OC3. The first color filter CF1 may be surrounded (e.g., surrounded in a plan view) by the first light blocking part BK1. The first color filter CF1 may overlap the first wavelength conversion part WLC1 in the thickness direction. The first color filter CF1 may selectively allow the first color light (e.g., red light) to pass therethrough and may block or absorb the second color light (e.g., green light) and the third color light (e.g., blue light). For example, the first color filter CF1 may be a red color filter and may include (or contain) a red colorant.

The second color filter CF2 may be disposed in the second emission area LA2 on the third planarization layer OC3. The second color filter CF2 may be surrounded by (e.g., may be surrounded along its periphery by) the first light blocking part BK1. The second color filter CF2 may overlap the second wavelength conversion part WLC2 in the thickness direction. The second color filter CF2 may selectively allow the second color light (e.g., green light) to pass therethrough and may block or absorb the first color light (e.g., red light) and the third color light (e.g., blue light). For example, the second color filter CF2 may be a green color filter and may include (or contain) a green colorant.

The third color filter CF3 may be disposed in the third emission area LA3 on the third planarization layer OC3. The third color filter CF3 may be surrounded by (e.g., may be surrounded along its periphery by) the first light blocking part BK1. The third color filter CF3 may overlap the light transmission part LTU in the thickness direction. The third color filter CF3 may selectively allow the third color light (e.g., blue light) to pass therethrough and may block or absorb the first color light (e.g., red light) and the second color light (e.g., green light). For example, the third color filter CF3 may be a blue color filter and contain a blue colorant.

The first to third color filters CF1, CF2, and CF3 may absorb some of the light coming from the outside of the display device 10 to reduce the amount of reflected external light. Thus, the first to third color filters CF1, CF2, and CF3 can reduce or prevent color distortion caused by the reflection of the external light.

Because the first to third color filters CF1, CF2, and CF3 are directly disposed on the third planarization layer OC3 of the wavelength conversion layer WLCL, the display device 10 may not require (or may omit) a separate substrate for the first to third color filters CF1, CF2, and CF3. Therefore, the thickness of the display device 10 may be relatively reduced.

The third passivation layer PAS3 may cover the first light blocking part BK1 and the first to third color filters CF1, CF2, and CF3 in the display area DA and may cover the second light blocking part BK2 and the second capping layer CAP2 in the non-display area NDA. The third passivation layer PAS3 may protect the first to third color filters CF1, CF2, and CF3.

The encapsulation layer TFE may be disposed on the third passivation layer PAS3 of the color filter layer CFL. The encapsulation layer TFE may planarize the top surface of the color filter layer CFL. For example, the encapsulation layer TFE may include at least one inorganic film to prevent permeation of air or moisture. In addition, the encapsulation layer TFE may include at least one organic film to protect the display device 10 from foreign substances, such as dust.

The anti-reflection layer ARF may be disposed on the encapsulation layer TFE. The anti-reflection layer ARF may prevent reflection of external light, thereby reducing a decrease in visibility due to reflection of external light. The anti-reflection layer ARF may protect the top surface of the display device 10. In some embodiments, the anti-reflection layer ARF may be omitted. In some embodiments, the anti-reflection layer ARF may be replaced with a polarizing film.

The first pad part PD1 may be disposed on the bottom surface of the substrate SUB. The first pad part PD1 may extend into (or may be inserted into) the first contact hole CNT1, that penetrates the substrate SUB, to be connected to the first connection line CWL1. The first pad part PD1 may supply an electrical signal received from the flexible film FPCB to the first connection line CWL1 through the second pad part PD2.

The second pad part PD2 may be disposed on the bottom surface of the substrate SUB and may be spaced apart from the first pad part PD1. The second pad part PD2 may be connected to the first pad part PD1 through a lead line LDL. The second pad part PD2 may receive various voltages or signals from the flexible film FPCB and may supply the corresponding voltages or signals to the first pad part PD1, the first connection line CWL1, and the second connection line CWL2.

A connection film ACF may attach the flexible film FPCB to the second pad part PD2. One surface of the connection film ACF may be attached to the second pad part PD2, and the other surface of the connection film ACF may be attached to the flexible film FPCB. For example, the connection film ACF may cover the entire second pad part PD2 but is not limited thereto.

The connection film ACF may include an anisotropic conductive film. When the connection film ACF includes an anisotropic conductive film, the connection film ACF may have conductivity in a region where the second pad part PD2 and a contact pad of the flexible film FPCB contact each other and may electrically connect the flexible film FPCB to the second pad part PD2.

The flexible film FPCB may be disposed on the bottom surface of the substrate SUB. One side of the flexible film FPCB may be connected to the second pad part PD2, and the other side of the flexible film FPCB may be connected to a source circuit board on the bottom surface of the substrate SUB. The flexible film FPCB may transmit the signal of the data driver DIC to the display device 10. For example, the data driver DIC may be an integrated circuit (IC). The data driver DIC may convert digital video data to an analog data voltage based on the data control signal of the timing controller and may supply the analog data voltage to the data line of the display area DA through the flexible film FPCB.

Figure 5:
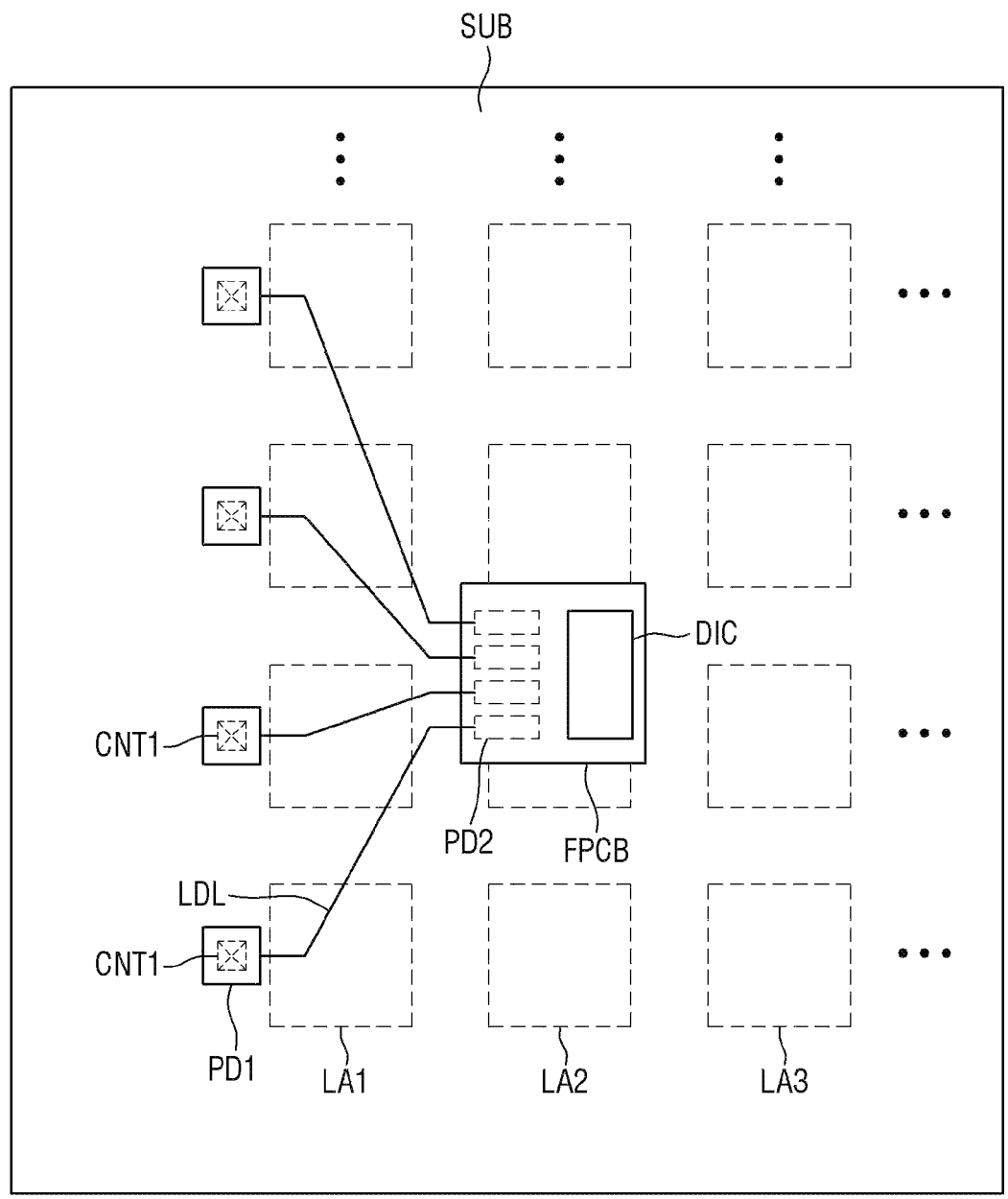
FIG. 5 is a bottom view illustrating a display device according to one embodiment.

FIG. 5 is a bottom view illustrating a display device according to one embodiment.

Referring to FIG. 5, the first pad part PD1 may be disposed on the bottom surface of the substrate SUB. The first pad part PD1 may extend into (or may be inserted into) the first contact hole CNT1 to be connected to the first connection line CWL1. The first pad part PD1 may be disposed between the first to third emission areas LA1, LA2, and LA3, but it is not limited thereto. The first pad part PD1 may supply an electrical signal received from the flexible film FPCB to the first connection line CWL1 through the second pad part PD2.

The second pad part PD2 may be disposed on the bottom surface of the substrate SUB and may be spaced apart from the first pad part PD1. The second pad part PD2 may be connected to the first pad part PD1 through a lead line LDL. The second pad part PD2 may receive various voltages or signals from the flexible film FPCB and may supply the corresponding voltages or signals to the first connection line CWL through the first pad part PD1.

The flexible film FPCB may be disposed on the bottom surface of the substrate SUB. One side of the flexible film FPCB may be connected to the second pad part PD2, and the other side of the flexible film FPCB may be connected to a source circuit board) on the bottom surface of the substrate SUB. The flexible film FPCB may transmit the signal of the data driver DIC to the display device 10.

Figure 6:
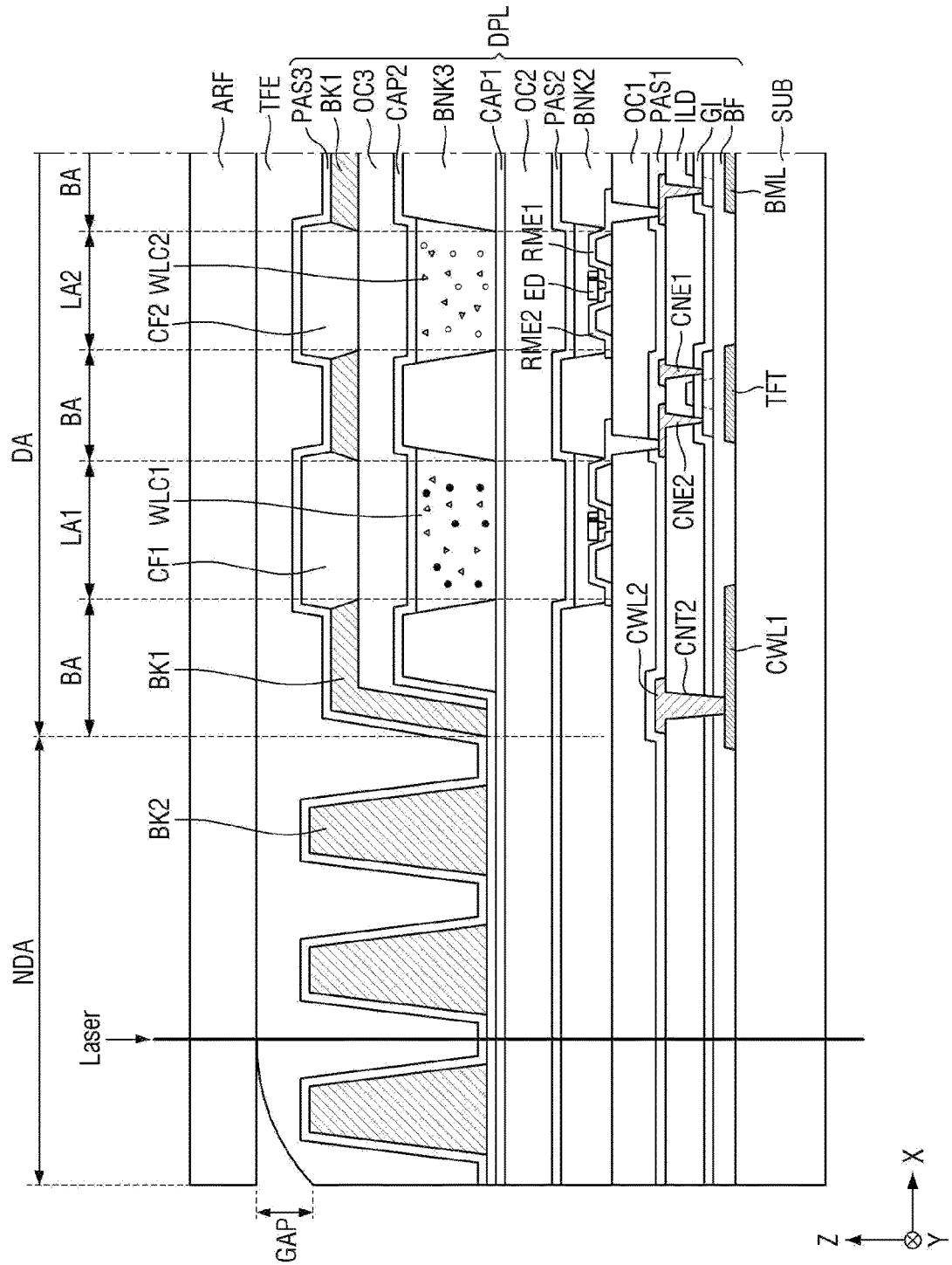
FIG. 6 is a cross-sectional view illustrating a cutting region of a display device according to one embodiment.
Figure 7:
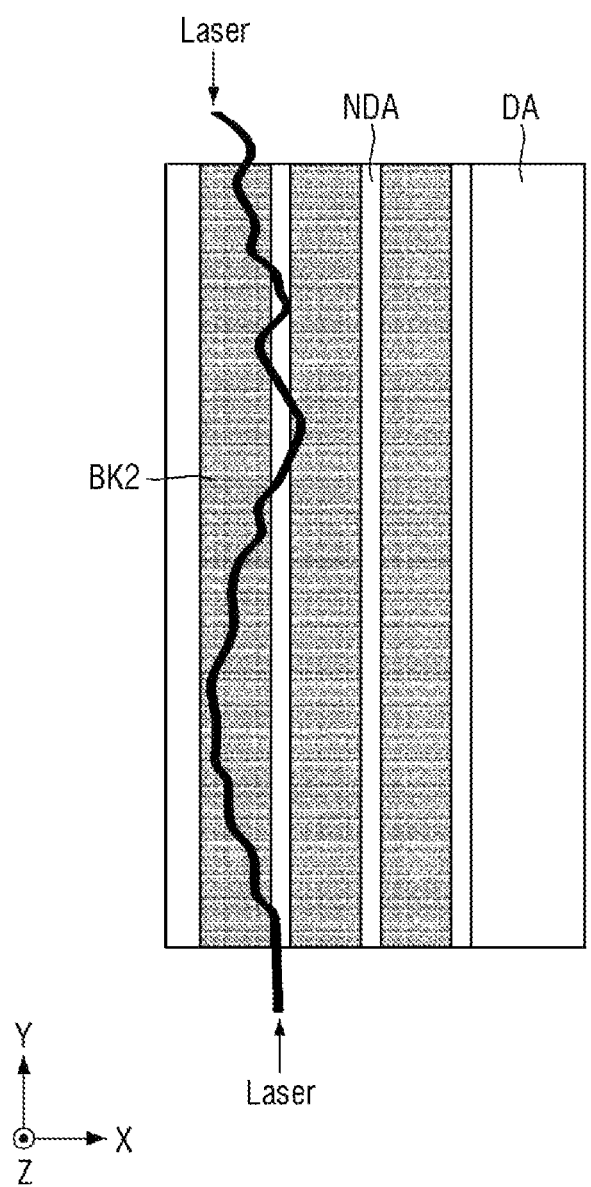
FIGS. 7 to 9 are plan views illustrating a cutting process of a display device according to one embodiment.
Figure 8:
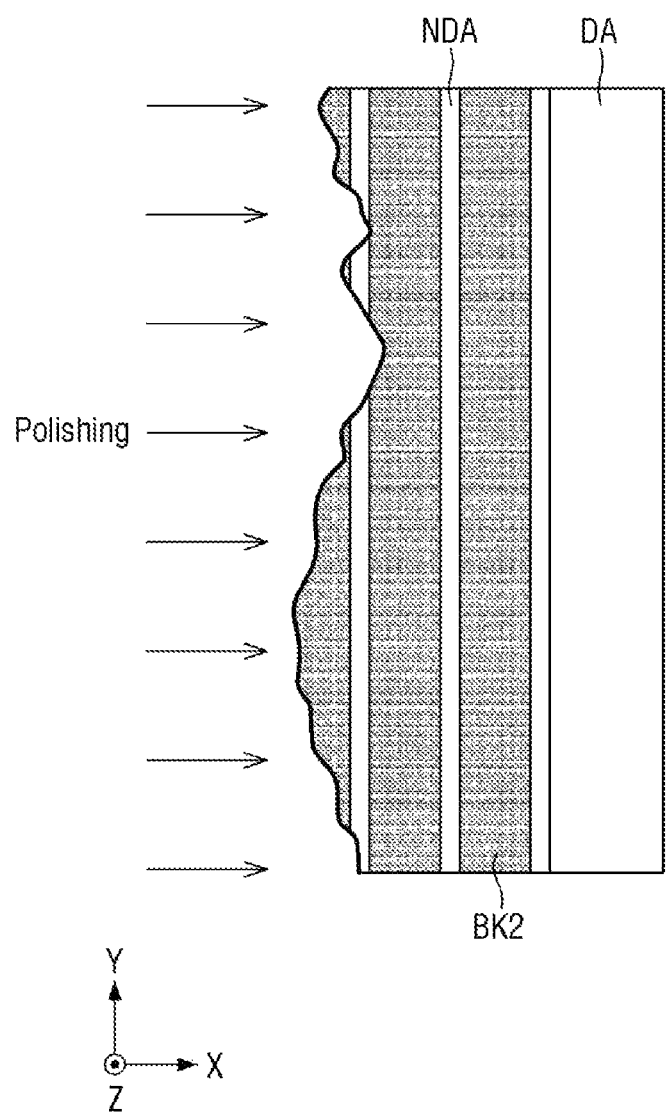
Figure 9:
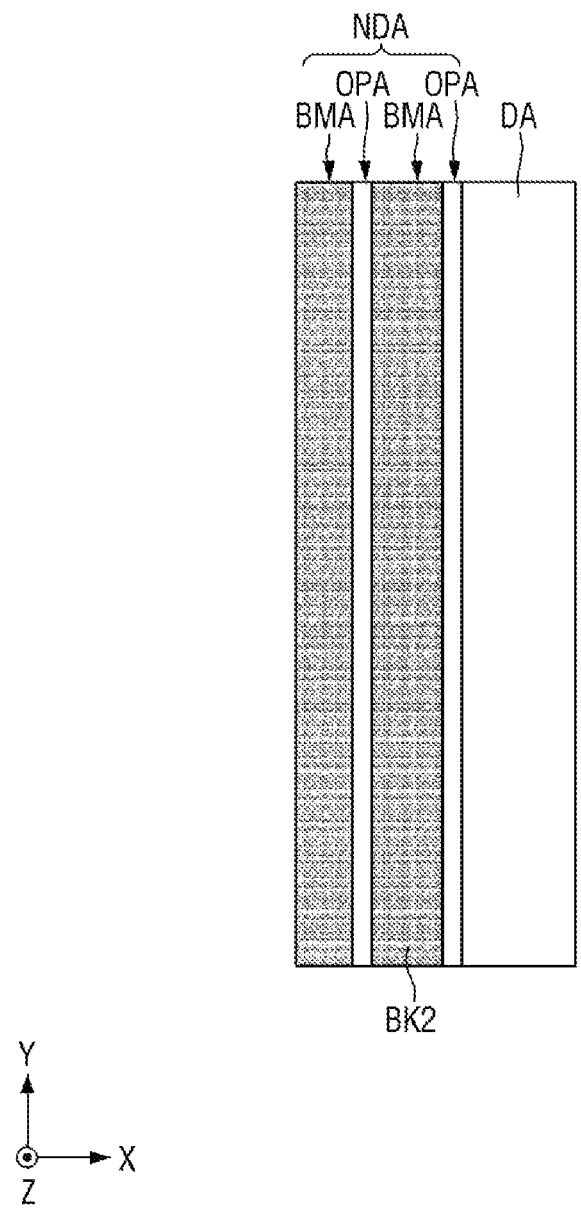

FIG. 6 is a cross-sectional view illustrating a cutting region of a display device according to one embodiment, and FIGS. 7 to 9 are plan views illustrating a cutting process of a display device according to one embodiment.

Referring to FIGS. 6 to 9, the display layer DPL may be stacked (or formed) on the substrate SUB. The thin film transistor layer TFTL, the light emitting element layer EML, the wavelength conversion layer WLCL, and the color filter layer CFL may be sequentially stacked (or formed) on the substrate SUB. The encapsulation layer TFE may cover the top surface of the color filter layer CFL, and the anti-reflection layer ARF may be attached on the encapsulation layer TFE.

The height of the second light blocking part BK2 may be higher than the height of the first light blocking part BK1 but lower than the height of the first color filter CF1. A gap GAP may decrease as the height of the second light blocking part BK2 is closer to the height of the first color filter CF1. The gap GAP may be formed between the anti-reflection layer ARF and the encapsulation layer TFE at the outermost part of the display device 10. When the gap GAP exists, a height difference in the anti-reflection layer ARF may occur. Accordingly, as a cutting line using an infrared laser is formed more inwardly than the gap GAP, the gap GAP between the anti-reflection layer ARF and the encapsulation layer TFE may be removed. By removing the gap GAP, the display device 10 may prevent permeation of foreign substances or moisture through the gap GAP.

In FIG. 6, the non-display area NDA may be cut by a cutting process using the infrared laser. The infrared laser may cut the anti-reflection layer ARF, the encapsulation layer TFE, the third passivation layer PAS3, the second light blocking part BK2, the second capping layer CAP2, the first capping layer CAP1, the light emitting element layer EML, the thin film transistor layer TFTL, and the substrate SUB. The second light blocking part BK2 may transmit infrared light, thereby reducing or minimizing an area to which heat of the laser is transmitted and reducing or minimizing an area damaged by the laser. As the infrared transmittance of the second light blocking part BK2 increases, an area damaged by the laser may be reduced.

In FIG. 7, the plurality of second light blocking parts BK2 may extend in a second direction (e.g., the Y-axis direction) and may be spaced apart from each other in the first direction (e.g., the X-axis direction). The second light blocking part BK2 may have a closed loop shape, but it is not limited thereto. The second light blocking part BK2 may block transmission of light. Accordingly, the second light blocking part BK2 may prevent light from leaking to the outside of the display device 10.

When the cutting process using the infrared laser is performed along the second direction (e.g., the Y-axis direction), the cut surface may be damaged by the infrared laser and may have an error (e.g., a predetermined error). Accordingly, the cut surface of the non-display area NDA may have an uneven surface or an irregular plane.

In FIG. 8, the cut surface of the display device 10 may be polished through a polishing process. A protruding portion of the cut surface may be removed by the polishing process, and a side surface of the display device 10 may be planarized. The display device 10 may reduce or minimize a laser-damaged area and reduce the size of the non-display area NDA through the polishing process.

In FIG. 9, as the polishing process is performed on the cut surface of the display device 10, the width of the second light blocking part BK2 disposed at the outermost part of the non-display area NDA may be smaller than the width of the second light blocking part BK2.

The non-display area NDA may have a pattern area BMA and an open area OPA. The pattern area BMA may be a region of the non-display area NDA in which the second light blocking part BK2 is disposed, and the open area OPA may be a region of the non-display area NDA except the pattern area BMA. For example, the area ratio of the pattern area BMA to the open area OPA may be in a range of about 1.5 to about 3:1 (1.5-3:1). Because the non-display area NDA includes the pattern area BMA that is about 1.5 to about 3 times larger than that of the open area OPA, it is possible to prevent light from leaking to the outside of the display device 10 and prevent the non-display area NDA from being recognized by the user.

Figure 10:
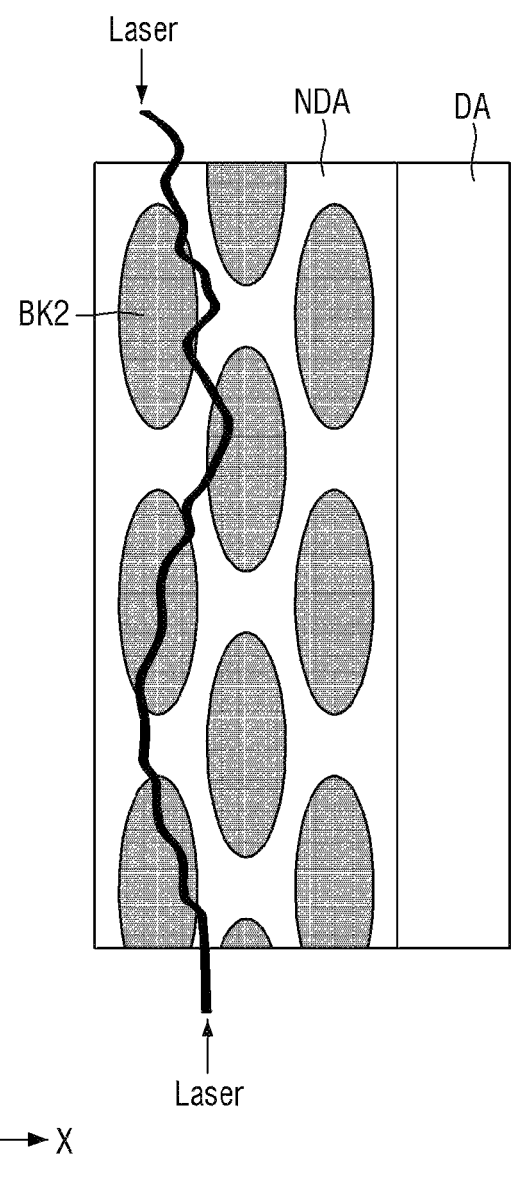
FIGS. 10 to 12 are plan views illustrating a cutting process of a display device according to another embodiment.
Figure 11:
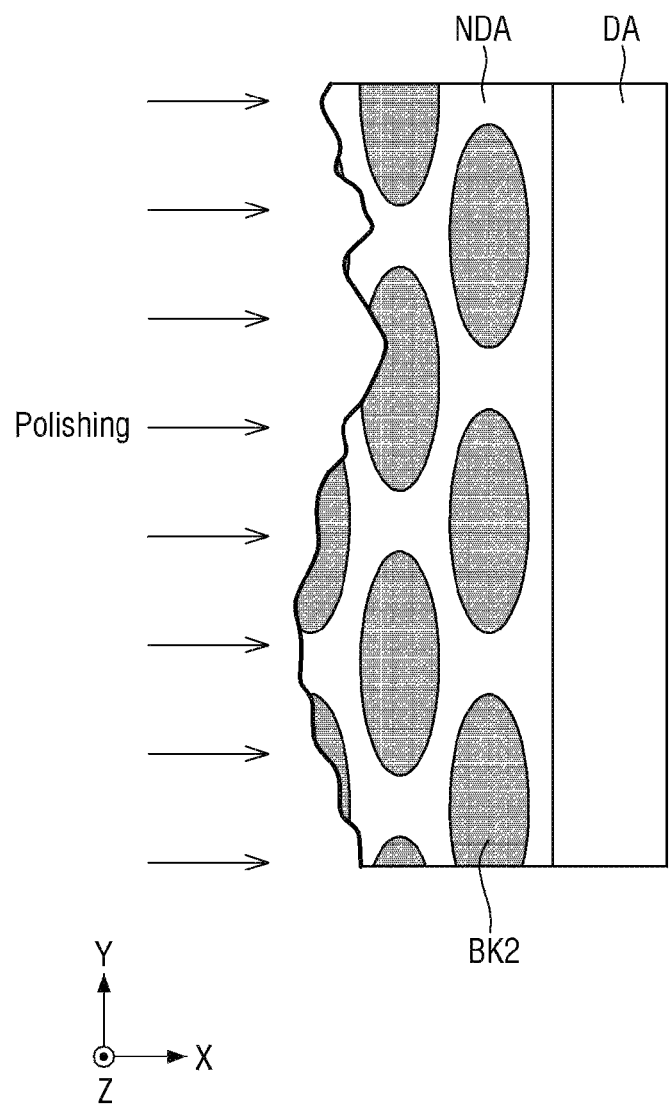
Figure 12:
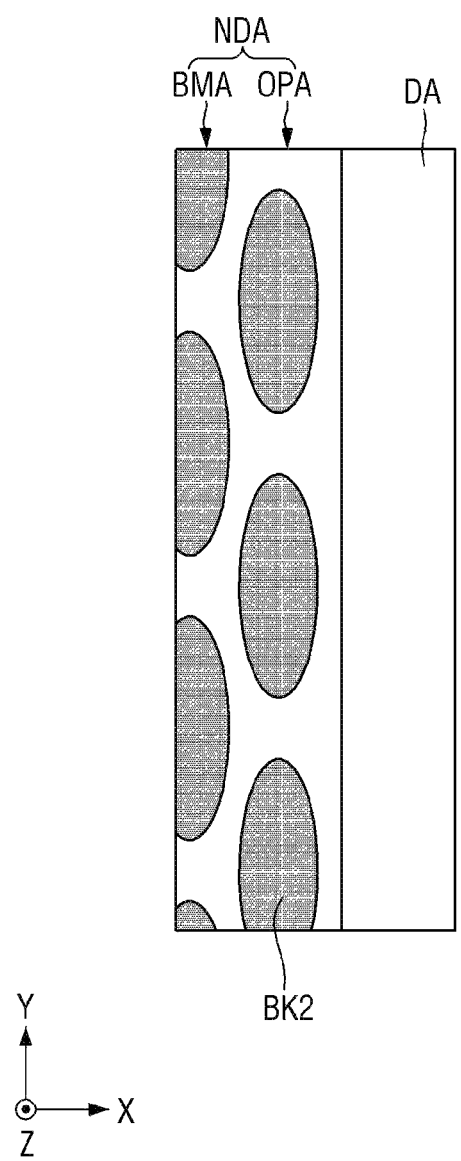

FIGS. 10 to 12 are plan views illustrating a cutting process of a display device according to another embodiment.

In FIG. 10, the plurality of second light blocking parts BK2 may be spaced apart from each other in the first direction (e.g., the X-axis direction) and the second direction (e.g., the Y-axis direction). The plurality of second light blocking parts BK2 may be adjacent to each other in a diagonal direction between the first direction (e.g., the X-axis direction) and the second direction (e.g., the Y-axis direction) or a diagonal direction between the opposite direction of the first direction (e.g., the X-axis direction) and the second direction (e.g., the Y-axis direction). For example, the second light blocking part BK2 may have an elliptical shape, but it is not limited thereto. As another example, the second light blocking part BK2 may have a circular shape or a semicircle shape. The second light blocking part BK2 may block transmission of light.

Accordingly, the second light blocking part BK2 may prevent light from leaking to the outside of the display device 10.

When the cutting process using the infrared laser is performed along the second direction (e.g., the Y-axis direction), the cut surface may be damaged by the infrared laser and may have an error (e.g., a predetermined error). Accordingly, the cut surface of the non-display area NDA may have an uneven surface or an irregular plane.

In FIG. 11, the cut surface of the display device 10 may be polished through a polishing process. A protruding portion of the cut surface may be removed by the polishing process, and a side surface of the display device 10 may be planarized. The display device 10 may reduce or minimize a laser-damaged area and reduce the size of the non-display area NDA through the polishing process.

In FIG. 12, as the polishing process is performed on the cut surface of the display device 10, the area of the second light blocking part BK2 disposed at the outermost part of the non-display area NDA may be smaller than the area of the second light blocking part BK2.

The non-display area NDA may have a pattern area BMA and an open area OPA. The pattern area BMA may be a region of the non-display area NDA in which the second light blocking part BK2 is disposed, and the open area OPA may be a region of the non-display area NDA except the pattern area BMA. For example, the area ratio of the pattern area BMA to the open area OPA may be in a range of about 1.5 to about 3:1 (1.5-3:1). Because the non-display area NDA includes the pattern area BMA that is about 1.5 to about 3 times larger than that of the open area OPA, it is possible to prevent light from leaking to the outside of the display device 10 and prevent the non-display area NDA from being recognized by the user.

Figure 13:
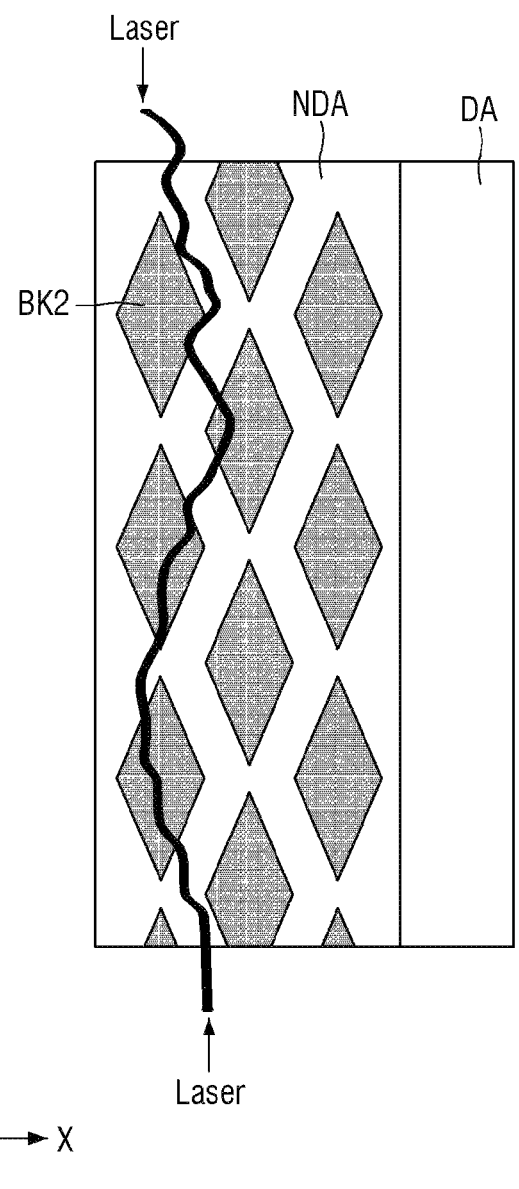
FIGS. 13 to 15 are plan views illustrating a cutting process of a display device according to another embodiment.
Figure 14:
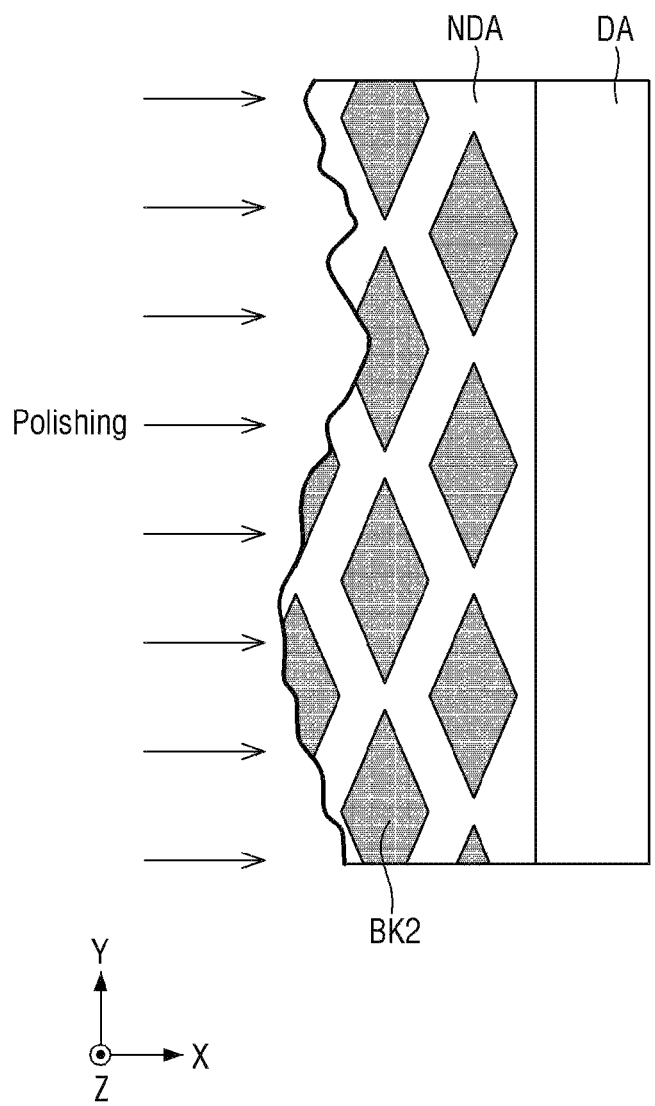
Figure 15:
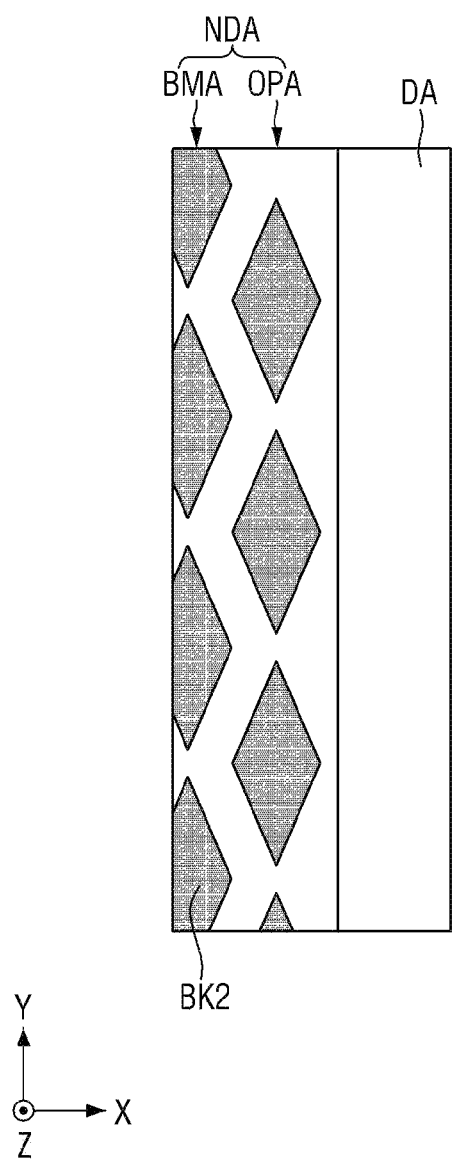

FIGS. 13 to 15 are plan views illustrating a cutting process of a display device according to another embodiment.

In FIG. 13, the plurality of second light blocking parts BK2 may be spaced apart from each other in the first direction (e.g., the X-axis direction) and the second direction (e.g., the Y-axis direction). The plurality of second light blocking parts BK2 may be adjacent to each other in a diagonal direction between the first direction (e.g., the X-axis direction) and the second direction (e.g., the Y-axis direction) or a diagonal direction between the opposite direction of the first direction (e.g., the X-axis direction) and the second direction (e.g., the Y-axis direction). For example, the second light blocking part BK2 may have a rhombic shape, but it is not limited thereto. The second light blocking part BK2 may block transmission of light. Accordingly, the second light blocking part BK2 may prevent light from leaking to the outside of the display device 10.

When the cutting process using the infrared laser is performed along the second direction (e.g., the Y-axis direction), the cut surface may be damaged by the infrared laser and may have an error (e.g., a predetermined error). Accordingly, the cut surface of the non-display area NDA may have an uneven surface or an irregular plane.

In FIG. 14, the cut surface of the display device 10 may be polished through a polishing process. A protruding portion of the cut surface may be removed by the polishing process, and a side surface of the display device 10 may be planarized. The display device 10 may reduce or minimize a laser-damaged area and reduce the size of the non-display area NDA through the polishing process.

In FIG. 15, as the polishing process is performed on the cut surface of the display device 10, the area of the second light blocking part BK2 disposed at the outermost part of the non-display area NDA may be smaller than the area of the second light blocking part BK2.

The non-display area NDA may have a pattern area BMA and an open area OPA. The pattern area BMA may be a region of the non-display area NDA in which the second light blocking part BK2 is disposed, and the open area OPA may be a region of the non-display area NDA except the pattern area BMA. For example, the area ratio of the pattern area BMA to the open area OPA may be in a range of about 1.5 to about 3:1 (1.5-3:1). Because the non-display area NDA includes the pattern area BMA that is about 1.5 to about 3 times larger than that of the open area OPA, it is possible to prevent light from leaking to the outside of the display device 10 and prevent the non-display area NDA from being recognized by the user.

Figure 16:
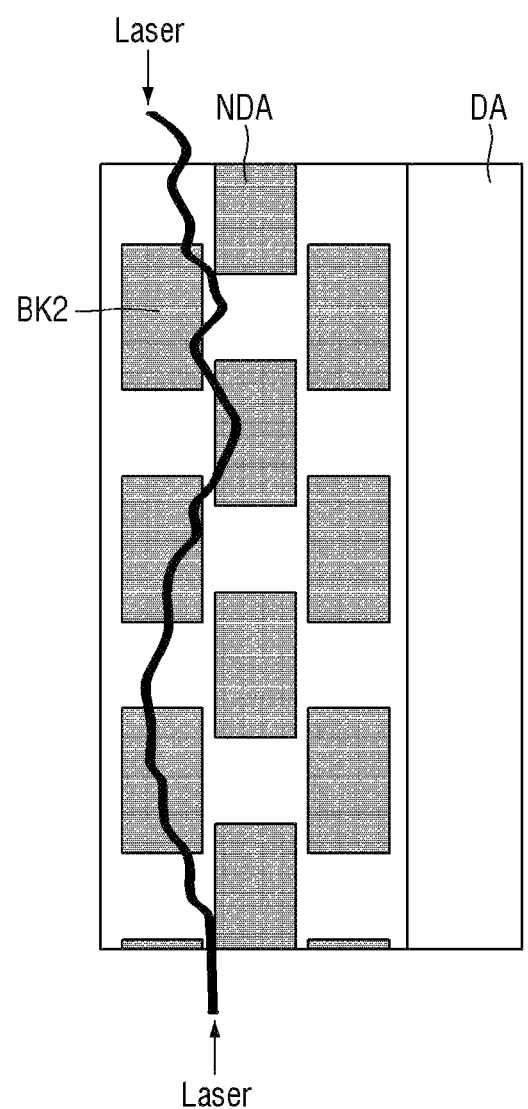
FIGS. 16 to 18 are plan views illustrating a cutting process of a display device according to another embodiment.
Figure 17:
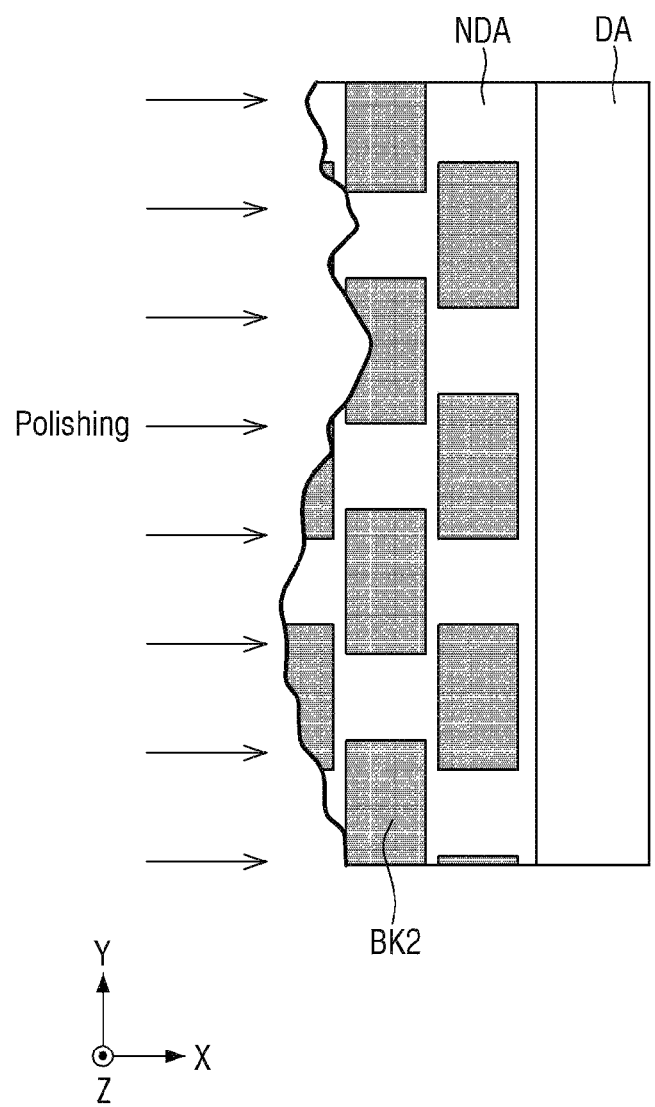
Figure 18:
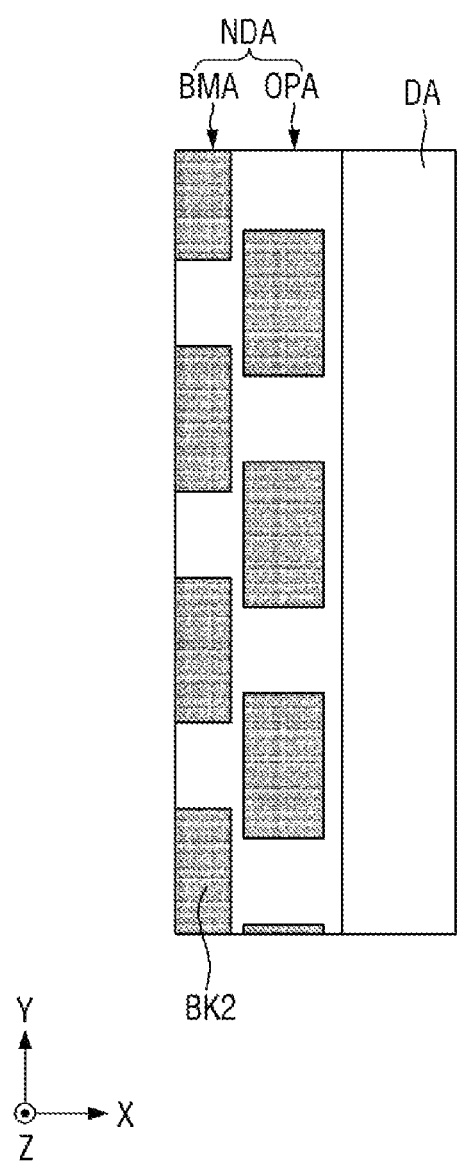

FIGS. 16 to 18 are plan views illustrating a cutting process of a display device according to another embodiment.

In FIG. 16, the plurality of second light blocking parts BK2 may be spaced apart from each other in the first direction (e.g., the X-axis direction) and the second direction (e.g., the Y-axis direction). The plurality of second light blocking parts BK2 may be adjacent to each other in a diagonal direction between the first direction (e.g., the X-axis direction) and the second direction (e.g., the Y-axis direction) or a diagonal direction between the opposite direction of the first direction (e.g., the X-axis direction) and the second direction (e.g., the Y-axis direction). For example, the second light blocking part BK2 may have a rectangular shape, but it is not limited thereto. As another example, the second light blocking part BK2 may have a polygonal shape. The second light blocking part BK2 may block transmission of light. Accordingly, the second light blocking part BK2 may prevent light from leaking to the outside of the display device 10.

When the cutting process using the infrared laser is performed along the second direction (e.g., the Y-axis direction), the cut surface may be damaged by the infrared laser and may have an error (e.g., a predetermined error). Accordingly, the cut surface of the non-display area NDA may have an uneven surface or an irregular plane.

In FIG. 17, the cut surface of the display device 10 may be polished through a polishing process. A protruding portion of the cut surface may be removed by the polishing process, and a side surface of the display device 10 may be planarized. The display device 10 may reduce or minimize a laser-damaged area and reduce the size of the non-display area NDA through the polishing process.

In FIG. 18, as the polishing process is performed on the cut surface of the display device 10, the area of the second light blocking part BK2 disposed at the outermost part of the non-display area NDA may be smaller than the area of the second light blocking part BK2.

The non-display area NDA may have a pattern area BMA and an open area OPA. The pattern area BMA may be a region of the non-display area NDA in which the second light blocking part BK2 is disposed, and the open area OPA may be a region of the non-display area NDA except the pattern area BMA. For example, the area ratio of the pattern area BMA to the open area OPA may be in a range of about 1.5 to about 3:1 (1.5-3:1). Because the non-display area NDA includes the pattern area BMA that is about 1.5 to about 3 times larger than that of the open area OPA, it is possible to prevent light from leaking to the outside of the display device 10 and prevent the non-display area NDA from being recognized by the user.

Figure 19:
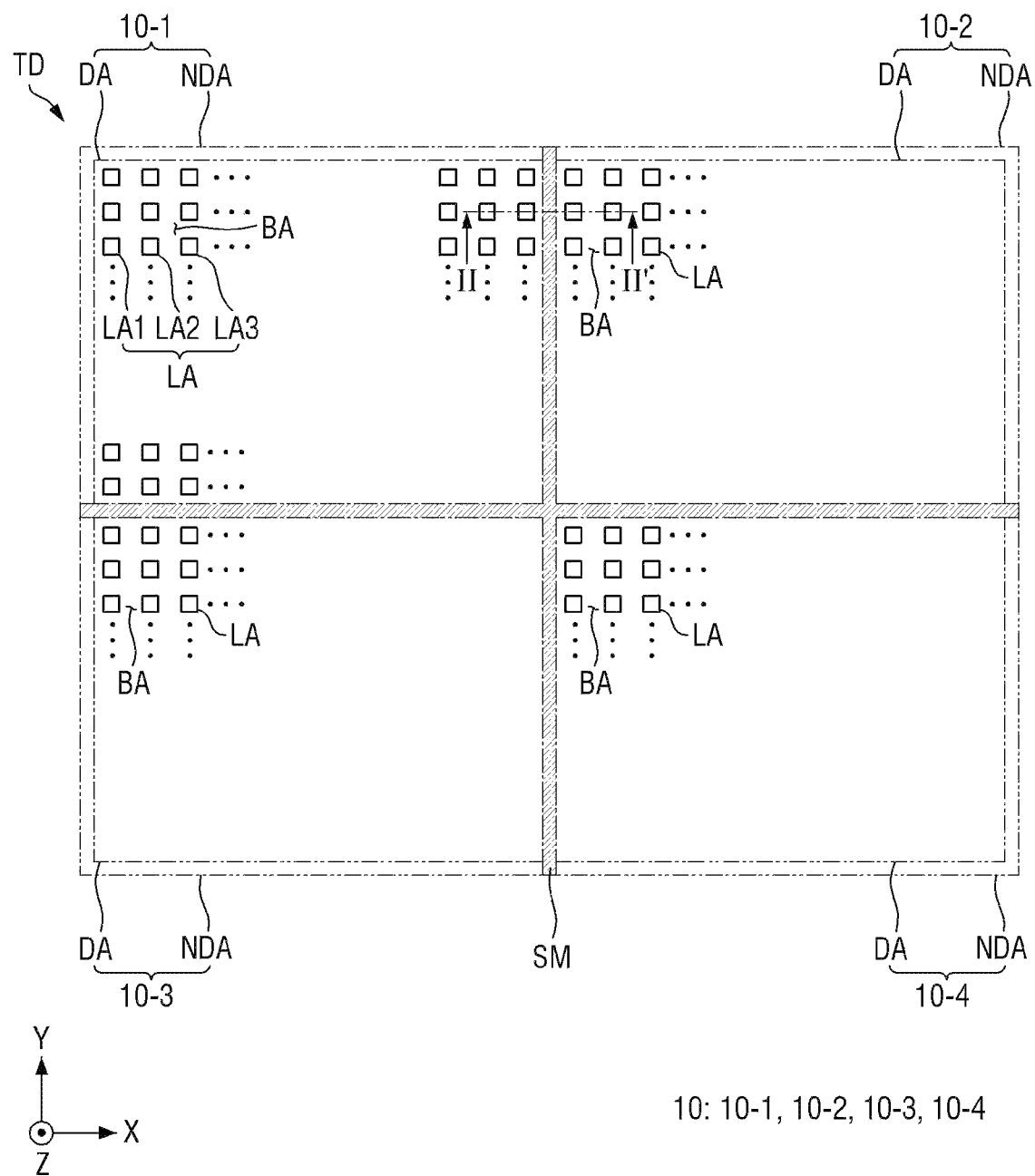
FIG. 19 is a plan view illustrating a bonding structure of a tiled display device according to one embodiment.
Figure 20:
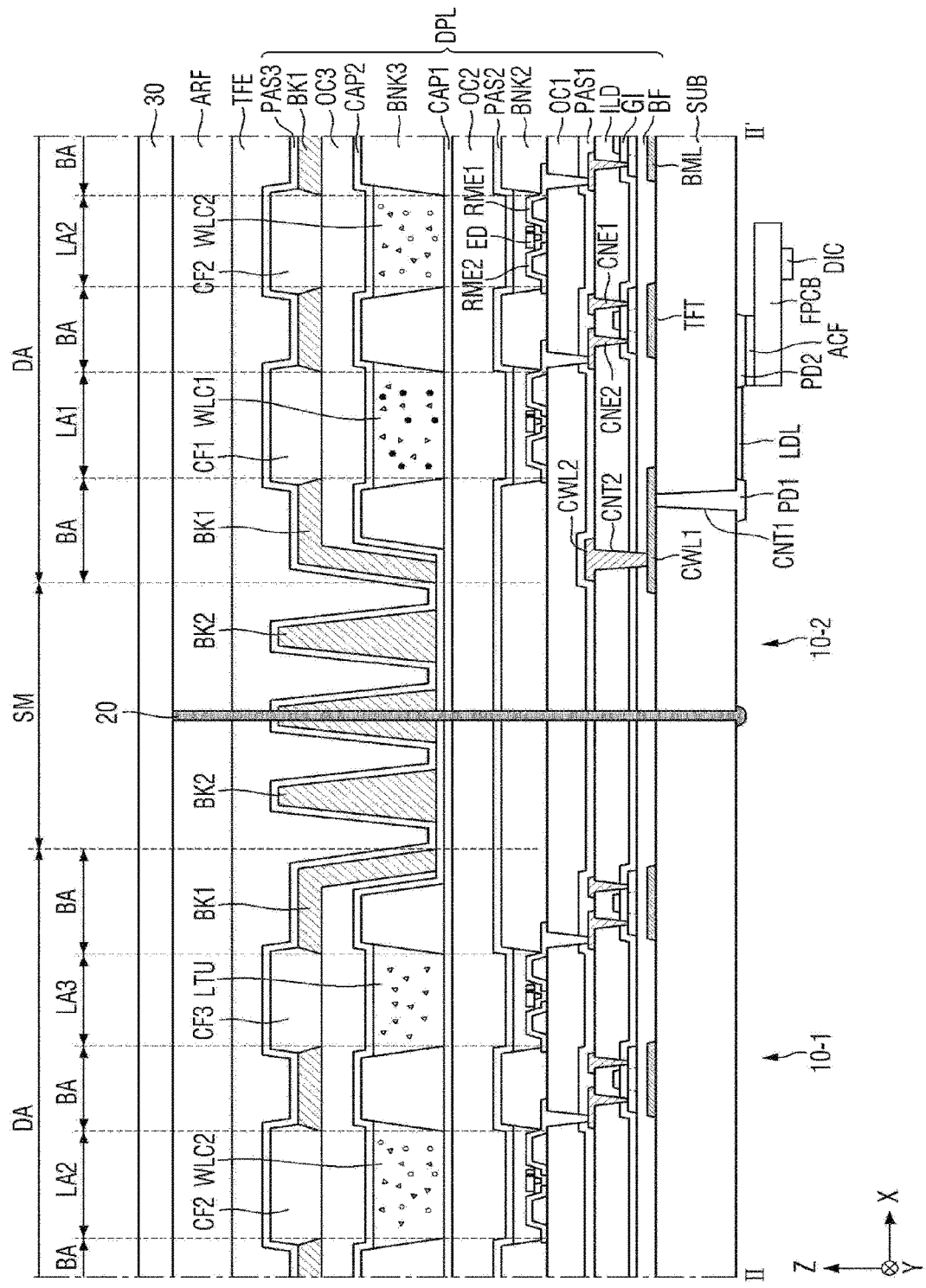
FIG. 20 is a cross-sectional view taken along the line II-II' of FIG. 19.

FIG. 19 is a plan view illustrating a bonding structure of a tiled display device according to one embodiment, and FIG. 20 is a cross-sectional view taken along the line II-II' of FIG. 19.

Referring to FIGS. 19 and 20, the tiled display device TD may include a plurality of display devices 10, a bonding member 20, and a cover member 30. The plurality of display devices 10 may be arranged in a grid form but are not limited thereto. The plurality of display devices 10 may be connected in the first direction (e.g., the X-axis direction) and/or the second direction (e.g., the Y-axis direction), and the tiled display device TD may have a particular shape. For example, the plurality of display devices 10 may have the same size but are not limited thereto. As another example, the plurality of display devices 10 may have different sizes.

The tiled display device TD may include first to fourth display devices 10-1 to 10-4. The number and connection relationship of the display devices 10 are not limited to the embodiment shown in FIG. 19. The number of the display devices 10 may be determined according to the size of each of the display devices 10 and the desired size of the tiled display device TD.

The display device 10 may have a display area DA and a non-display area NDA. The display area DA may include a plurality of pixels to display an image. The non-display area NDA may be disposed around the display area DA to surround (e.g., to extend around a periphery of) the display area DA and may not display an image.

The display device 10 may include a plurality of pixels arranged along a plurality of rows and columns in the display area DA. Each of the plurality of pixels may have an emission area LA defined by a pixel defining layer or bank and may emit light having a predetermined peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may be sequentially arranged repetitively in the first direction (e.g., the X-axis direction) in the display area DA. For example, the first emission area LA1 may be larger in size than the second emission area LA2, and the second emission area LA2 may be larger in size than the third emission area LA3. As another example, the first emission area LA1, the second emission area LA2, and the third emission area LA3 may be substantially the same in size.

The display area DA of the display device 10 may have a light blocking area BA surrounding (e.g., extending around a periphery of) the plurality of emission areas LA. The light blocking area BA may prevent the colored lights emitted from the first to third emission areas LA1, LA2, and LA3 from mixing with one another.

The tiled display device TD may have a coupling area SM disposed between a plurality of display areas DA. The tiled display device TD may be formed by connecting the non-display areas NDA of the adjacent display devices 10. The plurality of display devices 10 may be connected to each other through the bonding member 20 or an adhesive member disposed in the coupling area SM. Each of the coupling areas SM of the plurality of display devices 10 may not include a pad part or a flexible film attached to the pad part. Accordingly, the distance between the display areas DA of the plurality of display devices 10 may be small enough that the coupling area SM between the plurality of display devices 10 is not recognized by the user. In addition, the reflectance of external light of the display areas DA of the plurality of display devices 10 may be substantially the same as that of the coupling area SM between the plurality of display devices 10. Accordingly, in the tiled display device TD, the coupling area SM between the plurality of display devices 10 may not be recognized by the user, thereby reducing a sense of disconnection between the plurality of display devices 10 and improving a sense of immersion in an image.

The coupling area SM may include the second light blocking part BK2. For example, the width of the second light blocking part BK2 adjacent to the bonding member 20 may be smaller than the width of the second light blocking part BK2, but it is not limited thereto. The second light blocking part BK2 may prevent light of the plurality of display devices 10 from leaking through the coupling area SM. By including the second light blocking part BK2 disposed on the coupling area SM, the tiled display device 10 may reduce a luminance ratio between the display area DA and the coupling area SM. Alternatively, by including the second light blocking part BK2 disposed in the coupling area SM, the tiled display device 10 may reduce a difference between the maximum luminance of the display area DA and the maximum luminance of the coupling area SM. Accordingly, the second light blocking part BK2 may prevent the coupling area SM between the plurality of display devices 10 from being recognized by the user, thereby reducing a sense of disconnection between the plurality of display devices 10 and improving a sense of immersion in an image.

The coupling area SM may have the pattern area BMA, the open area OPA, and the bonding member 20. The pattern area BMA may be a region of the coupling area SM in which the second light blocking part BK2 is disposed, and the open area OPA may be a region of the coupling area SM except the pattern area BMA and the bonding member 20. For example, the area ratio of the pattern area BMA to the open area OPA may be in a range of about 1.5 to about 3:1 (1.5-3:1). Because the coupling area SM has the pattern area BMA that is about 1.5 to about 3 times larger than that of the open area OPA, the coupling area SM may not be recognized by the user, thereby improving a sense of disconnection between the plurality of display devices 10 and improving a sense of immersion in an image.

The tiled display device TD may bond the side surfaces of the adjacent display devices 10 to each other by using the bonding member 20 disposed between the plurality of display devices 10. The bonding member 20 may connect the side surfaces of the first to fourth display devices 10-1 to 10-4 arranged in a grid form to implement the tiled display device TD. The bonding member 20 may bond side surfaces of the substrates SUB, side surfaces of the thin film transistor layers TFTL, side surfaces of the light emitting element layers EML, side surfaces of the first and second capping layers CAP1 and CAP2, side surfaces of the second light blocking parts BK2, side surfaces of the third passivation layers PAS3, side surfaces of the encapsulation layers TFE, and side surfaces of the anti-reflection layers ARF of the display devices 10 adjacent to each other.

For example, the bonding member 20 may be made of an adhesive or a double-sided tape having a relatively thin thickness to reduce or minimize the gap between the plurality of display devices 10. As another example, the bonding member 20 may be formed of a bonding frame having a relatively thin thickness to reduce or minimize the gap between the plurality of display devices 10. Accordingly, in the tiled display device TD, the user may not recognize the coupling area SM between the plurality of display devices 10.

The cover member 30 may be disposed on the top surfaces of the plurality of display devices 10 and the bonding member 20 to cover the plurality of display devices 10 and the bonding member 20. For example, the cover member 30 may be disposed on top surfaces of the anti-reflection layer ARF and on the bonding member 20 of each of the plurality of display devices 10. The cover member 30 may protect the top surface of the tiled display device TD.

What is claimed is:

1. A display device comprising:
    a substrate having a display area and a non-display area extending around the display area, the display area having emission areas and a light blocking area;
    a thin film transistor layer on the substrate and comprising thin film transistors;
    a light emitting element layer on the thin film transistor layer and comprising light emitting elements;
    a wavelength conversion layer on the light emitting element layer to convert a peak wavelength of light provided from at least some of the light emitting elements; and
    a color filter layer on the wavelength conversion layer, the color filter layer comprising:
        color filters in each of the emission areas;
        a first light blocking part in the light blocking area; and
        a second light blocking part in the non-display area.

2. The display device of claim 1, wherein a height of the second light blocking part is greater than or equal to a height of the first light blocking part and less than or equal to a height of the color filters.

3. The display device of claim 1, wherein the non-display area has a pattern area at where the second light blocking part is arranged and an open area excluding the pattern area, and
    wherein an area ratio of the pattern area to the open area is in a range of 1.5 to 3:1.

4. The display device of claim 1, wherein the second light blocking part has a closed loop shape extending around the display area.

5. The display device of claim 1, wherein the second light blocking part has a circular shape, an elliptical shape, a semicircular shape, or a polygonal shape.

6. The display device of claim 1, wherein the second light blocking part comprises a material that blocks visible light and transmits infrared light.

7. The display device of claim 1, wherein the color filter layer further comprises a plurality of the second light blocking parts, and
    wherein a width of one of the second light blocking parts at an outermost part of the non-display area is smaller than a width of another one of the second light blocking parts.

8. The display device of claim 1, wherein the emission areas has first to third emission areas emitting different colors, and
    wherein the wavelength conversion layer comprises:
        a first wavelength conversion part in the first emission area to convert a peak wavelength of light incident from the light emitting elements into a first peak wavelength;
        a second wavelength conversion part in the second emission area to convert a peak wavelength of light incident from the light emitting elements into a second peak wavelength different from the first peak wavelength; and
        a light transmission part in the third emission area to transmit the light incident from the light emitting elements.

9. The display device of claim 8, wherein the color filters comprise:
    a first color filter on the first wavelength conversion part;

a second color filter on the second wavelength conversion part; and a third color filter on the light transmission part, and wherein the first light blocking part is on the wavelength conversion layer and has a grid shape extending around the first to third color filters.

10. The display device of claim 9, wherein the color filter layer further comprises a plurality of the first light blocking parts, and wherein one of the first light blocking parts at an outermost part from among the first light blocking parts surrounds a side surface of the wavelength conversion layer.

11. The display device of claim 9, wherein the second light blocking part is on the light emitting element layer and surrounds a side surface of the wavelength conversion layer to be spaced apart therefrom.

12. A tiled display device comprising:

display devices each having a display area and a coupling area between the display areas, each of the display areas having emission areas and a light blocking area; and a bonding member bonding the display devices in the coupling area, wherein each of the display devices comprises:
a substrate;
a thin film transistor layer on the substrate and comprising thin film transistors;
a light emitting element layer on the thin film transistor layer and comprising light emitting elements;
a wavelength conversion layer on the light emitting element layer to convert a peak wavelength of light provided from at least some of the light emitting elements; and
a color filter layer on the wavelength conversion layer, the color filter layer comprising:
color filters in each of the emission areas;
a first light blocking part in the light blocking area; and
a second light blocking part in the coupling area.

13. The tiled display device of claim 12, wherein a height of the second light blocking part is greater than or equal to a height of the first light blocking part and less than or equal to a height of the color filters.

14. The tiled display device of claim 12, wherein the coupling area has a pattern area at where the second light blocking part is arranged and an open area excluding the pattern area, and wherein an area ratio of the pattern area to the open area is in a range of 1.5 to 3:1.

15. The tiled display device of claim 12, wherein the second light blocking part has a closed loop shape extending around the display area.

16. The tiled display device of claim 12, wherein the second light blocking part has a circular shape, an elliptical shape, a semicircular shape, or a polygonal shape.

17. The tiled display device of claim 12, wherein the second light blocking part comprises a material that blocks visible light and transmits infrared light.

18. The tiled display device of claim 12, wherein the bonding member is configured to bond side surfaces of the substrates, side surfaces of the thin film transistor layers, side surfaces of the light emitting element layers, and side surfaces of the second light blocking parts of the display devices.

19. The tiled display device of claim 12, wherein each of the display devices further comprises:
an encapsulation layer on the color filter layer; and
an anti-reflection layer on the encapsulation layer to prevent reflection of external light.

20. The tiled display device of claim 19, further comprising a cover member covering the anti-reflection layer of each of the display devices and a top surface of the bonding member.

* * * * *